(12) United States Patent
Vernackt et al.

(10) Patent No.: US 6,396,561 B1
(45) Date of Patent: May 28, 2002

(54) METHOD AND DEVICE FOR EXPOSING BOTH SIDES OF A SHEET

(75) Inventors: Marc Vernackt, Overmere; Ronny A. De Loor, Gent; Anne-Marie F. Empsten, Lint, all of (BE); Mark Ryvkin, South Windsor, CT (US)

(73) Assignee: ManiaBarco N.V., Zwijnaarde (BE)

( * ) Notice: Subject to any disclaimer, the term of this patent is extended or adjusted under 35 U.S.C. 154(b) by 0 days.

(21) Appl. No.: 09/435,983

(22) Filed: Nov. 8, 1999

Related U.S. Application Data

(60) Provisional application No. 60/107,842, filed on Nov. 10, 1998.

(51) Int. Cl.[7] .................... G03B 27/32; G03B 27/52; G03C 5/00; H04N 1/04; A61N 5/00
(52) U.S. Cl. .................. 355/26; 355/23; 355/24; 355/40; 355/53; 355/67; 430/30; 430/311; 430/312; 430/314; 358/496; 356/399; 356/400; 356/401; 250/492.2; 250/492.22; 250/548
(58) Field of Search .................. 355/26, 24, 23, 355/40, 53, 67; 430/30, 311, 312, 314; 358/496; 356/399, 400, 401; 250/548, 492.2, 492.22

(56) References Cited

U.S. PATENT DOCUMENTS

| | | | |
|---|---|---|---|
| 4,221,974 A | * 9/1980 | Mueller et al. | 250/563 |
| 4,543,615 A | 9/1985 | Van Campenhout et al. | 358/285 |
| 4,743,974 A | 5/1988 | Lockwood | 358/285 |
| 4,962,464 A | 10/1990 | Henzi et al. | 364/518 |
| 5,208,818 A | 5/1993 | Gelbart et al. | 372/30 |
| 5,285,236 A | 2/1994 | Jain | 355/53 |
| 5,337,151 A | 8/1994 | Baxter et al. | 356/401 |
| 5,357,106 A | 10/1994 | Wilson | 250/236 |
| 5,488,485 A | 1/1996 | Amemiya | 358/444 |
| 5,548,372 A | 8/1996 | Schroeder et al. | 355/53 |
| 5,580,698 A | 12/1996 | Andersen | 430/308 |
| 5,627,007 A | 5/1997 | Van den Bergh et al. | 430/200 |
| 5,627,378 A | 5/1997 | Baxter | 250/455.11 |
| 5,654,817 A | 8/1997 | De Loor | 359/201 |
| 5,880,820 A | 3/1999 | Sorel et al. | 355/95 |
| 5,907,230 A | 5/1999 | Sorel et al. | 318/649 |
| 5,923,403 A | 7/1999 | Jain | 355/26 |

FOREIGN PATENT DOCUMENTS

| | | | | |
|---|---|---|---|---|
| EP | 618505 | 10/1994 | | G03F/7/20 |
| EP | 0632302 | 4/1995 | | G02B/27/00 |
| EP | 0422525 | 1/1996 | | H01J/9/14 |
| WO | WO 9828608 | 7/1998 | | G01N/21/88 |

* cited by examiner

*Primary Examiner*—Russell Adams
*Assistant Examiner*—Khaled Brown
(74) *Attorney, Agent, or Firm*—Dov Rosenfeld; Inventek

(57) ABSTRACT

A device is described for exposing both sides of a light sensitive sheet such as a printed circuit board panel according to imaging data. The device comprises an optical system for scanning the sensitive sheet by one or more beams. The optical system scans both sides with the scan lines on one side mutually positioned with respect to the scan lines on the other side. According to one implementation, the optical system includes two optical scanning units driven by a single source, with a switch alternating the beam from the source to one then the other optical scanning unit.

53 Claims, 12 Drawing Sheets

METHOD AND DEVICE FOR EXPOSING BOTH SIDES OF A SHEET

CROSS-REFERENCE TO RELATED APPLICATION

This application claims the benefit of U.S. Provisional Patent Application Serial No. 60/107,842 for METHOD AND DEVICE FOR EXPOSING BOTH SIDES OF A SHEET to inventors Vernackt, et al., Assignee Barco Graphics, N. V., filed Nov. 10, 1998.

FIELD OF INVENTION

This invention relates to a method and a device for exposing a sheet. More particularly, this invention relates to a method and device for exposing both sides of a sensitized sheet for direct imaging of printed circuit board panels, printing plates, or other sensitized sheets.

BACKGROUND

One aspect of this invention is exposing a sheet that is provided with a sensitive is layer, for example a light-sensitive layer on one or both sides (i.e., on the surface or surfaces of one or both sides). A light-sensitive layer herein includes a layer sensitive to thermal (e.g., infra-red or IR) radiator, visible light, and ultra-violet (UV) radiation.

One application of the invention is the direct imaging of a single or double-sided sensitized sheet for producing a printed circuit board (PCB). Other applications will be clear from the following detailed description.

It is known that printed circuit boards may be composed of several PCB panels, each of which is provided with an electrical circuit. When there are only two layers, the board is commonly called a double-sided board, and when there are more than two layers, the board is commonly called a multi-layer board. A common way of manufacturing a multi-layer board is by fixing several panels together, each panel having a single printed circuit on one side, or a circuit on each side. "Outer" panels are those that face the outside of a multi-layer PCB, and "inner panels" are the interior panels. Typically, the inner panels have a circuit on both sides, while the outer panels have a circuit only on one, the outer side. Each inner panel resembles a thin double-sided PCB in that the panel is comprised of an insulating substrate which is clad on both sides with metallic foil, typically copper foil. A printed circuit is formed on any circuit side of an inner panel by that side's metal cladding having a light-sensitive layer laid on top of the metal. The light-sensitive layer is exposed to light (typically ultra-violet (UV) radiation) at selected locations, then processed by a photographic process that removes the layer at selected locations. An etching process is then applied to remove those parts of the layer of metal not necessary for forming the actual circuit. Once all the double-sided inner panels are produced, they are fused (pressed) together by placing an insulating binding material, typically a partially cured epoxy-resin material called prepreg, between the panels. Unexposed outer foils are placed on the outside of the double-sided inner panels, again with prepreg in between. All the layers are now laminated by applying heat and pressure that causes the prepreg to flow and bond to the surfaces of the inner panels and the outer foils. Holes are now drilled on the laminated multi-layer board, including holes for mounting electrical components inserted into the board (called "mounting holes"), and holes for making contacts from one layer to one or more other layers (feedthroughs, also called vias or conductive vias). The holes typically are plated through. Each side of the multi-layer panel now is sensitized, then exposed and processed to form the two outer printed circuits in exactly the same manner as forming circuits on the inner panels.

Note that because a multi-layer panel is exposed in the same way as an inner PCB panel, the words "PCB panel" or simply panel will mean either a complete PCB board, an inner PCB panel, or a post-lamination multi-layer panel.

One difficulty in producing multi-layered printed circuit boards is the strict requirement for accuracy in positioning the different PCB panels together to ensure that the different circuits are positioned very accurately relative to each other. In particular, the mounting holes and vias need to be very accurately placed on each layer's circuits. For a particular tolerance for the placement of a circuit, it is clear that any deviations in the specified location of the circuits on each of the layers may be additive, so that at any one location, there could be large deviations. For the case of double-sided panels, including the multi-layer panel after lamination, it is even more difficult to position the circuits accurately enough relative to each other.

A common method for producing printed circuit boards is to first produce artwork, which is an accurately scaled configuration used to produce a master pattern of a printed circuit, and is generally prepared at an enlarged scale using various width tapes and special shapes to represent conductors. The items of artwork, once reduced, for example, by a camera onto film to the correct final size, are referred to as phototools and are used as masks for exposing the sensitized layers. Because the photographic reduction is never 100 percent accurate, more accurate phototools are produced nowadays using photoplotters rather than photographic reduction.

However produced, physical phototools are susceptible to damage. In addition, whenever any amendments need to be made to any circuit, new phototools need to be produced. Furthermore phototools, sometimes in the form of photographic negatives, are difficult to store. They also may not be stable; their characteristics might change with temperature and humidity changes.

There thus are advantages to directly imaging the required circuit patterns onto PCB panels, for example PCB panels that include a light-sensitive layer on one or both sides. The same advantage also is applicable to directly imaging printing plates that include a UV, visible light, or thermally-sensitive layer. Often such sensitive sheets as used for PCBs or thermal printing plates are rigid, so that the scanning apparatus for exposing such sheets for direct imaging (e.g., directly exposing printing plates or directly exposing PCB panels) is of the flat-bed type in which the sheet is disposed on a horizontal table for exposure by the light energy (e.g., UV light or infrared) produced by the scanner. Such scanning apparatuses are typically quite bulky because of the horizontal table. Also, such direct imaging systems expose one side at a time, and there are problems accurately aligning the two sides for double-sided exposure.

Thus there is a need in the art for an improved method and apparatus for exposing a sheet, one or both sides of which are provided with a light-sensitive layer, which may be a UV sensitive layer, a visible light-sensitive layer, or a thermally sensitive layer.

In particular, there is a need in the art for a method and apparatus for reducing the probability of differences occurring between the required locations of the desired scanned regions (e.g., the images) at the respective sides of the sheet.

In the case of the sheet being a PCB panel, it is desired to reduce the probability of there being unwanted differences in locations of the printed circuits at the respective sides of the PCB panel.

SUMMARY OF THE INVENTION

Described herein are a method and an apparatus for exposing a light-sensitive sheet, in which the exposing is carried out by one or more optical beams projected onto the respective light-sensitive layers, with the particularity that the scanning is carried out from two opposite sides of the sheet to be scanned. Optical herein includes in a non-limiting way thermal radiation such as infra-red, UV and visible light.

In a preferred embodiment the exposing operations at both sides are carried out simultaneously. Furthermore, in a particular embodiment, the exposing operations are carried out by scanning simultaneously at the same portions of each side of the sheet. That is, when carrying out a scanning action at a particular region at one side, the scanning of the corresponding region at the opposite side of the sheet is done at substantially (and not necessarily exactly) the same time.

In the preferred embodiment, only one energy source, for example, a UV light source, is used for scanning both sensitive layers, this arrangement having the advantage that the resulting device for carrying out the method can be relatively compact. A further advantage of using one energy source for both sides is that the cost is lower than if more than one source is used. Using the same source for exposing both sides raises the system's optical efficiency, so that the laser power requirements may be lowered. Other embodiments may include more than one energy source.

One advantage of exposing the sheet on either or both sides is that the scanning can be carried out in a shorter amount of time than if one needed to present the sheet twice to the scanning apparatus. Scanning both sides simultaneously further reduces the scanning time.

When exposing both sides at the same time, the relative positioning of the scanned regions (i.e., the images) created at the respective sides is less sensitive to any panel or sheet changes or distortions that may occur over time. Furthermore, exposing both sides in a device that includes a mutual positioning mechanism assures that the images of the two sides are positionally accurate with respect to each other.

In one embodiment, optical exposing units are used for exposing the sides of the sheet by the energy of the one or more energy sources, and these optical exposing units may be positioned opposite each other, either in front of each side of the sheet or offset therefrom. In one embodiment, the optical exposing units are optical scanning units which form one or more optical beams which form scan lines on each side, while in another embodiment, applicable to exposing the sides of the sensitive sheet according to imaging data, the optical exposing units are imaging units that project sub-images ("tiles") according to the imaging data. Complete images may be exposed for example in a step and re-image manner in which new sub-images are sequentially imaged after a stepping motion to the new sub-image location, each placement of a new sub-image using the imaging data corresponding to the new sub-image. Alternate flat-bed imaging methods similarly may be used together with a cross-positioning mechanism for accurately positioning the two sides relative to each other. Another aspect of the present invention is a method and apparatus for adjusting the scanning movement of the beam or beams of each optical scanning unit or the sub-images of each optical imaging unit relative to each other, so that the sets of scan lines or sub-images covering the desired regions generated by both units are automatically mutually positioned. In one embodiment of the adjustment method applied in the beam forming case, the beam of at least one of the scanning units is sensed by means of a detecting module coupled to the other scanning unit. That is, in the preferred embodiment, the beams produced by both optical scanning units are sensed by a single detection module. In this way perfect registration is substantially obtained. The particular embodiment of the detection module makes such mutual adjustment possible, irrespective of the thickness of the sheet to be scanned, within some dimensional limits. Other embodiments include using more than one optical detection module to detect the beams produced by both optical scanning units.

According to another aspect of the invention, an optical detection module is used which detects the cross-scan position of the beam (both beams in the case of the mutual positioning system) in a manner that is insensitive to the focus of the beam, using two photodiode elements side by side so that the difference in the beam path traversed through each diode is indicative of the cross beam position. Several embodiments of such a detection module are described with the shape of the surfaces providing different desirable characteristics. In some of these embodiments, the two diodes also provide an indication of when a beam traverses a fixed point in the scan beam direction. In other of these embodiments, an additional photodiode element is provided and the interface of such a third photodiode with one of the other two photodiodes provides for indicating when a beam crosses a given location in the scan line direction.

According to yet another aspect of the invention, the above-mentioned object of exposing both sides of a sheet is obtained by providing a method wherein the exposing is done by means of only one exposing unit located at one side, whereas each side of the sensitive sheet, which may consist of a plate, board or PCB panel, is presented successively to the optical exposing unit, the sheet being fixed in a carrier from the beginning of the exposing (e.g., by scanning by an optical scanning unit) of the first side until the end of the exposing of the second side. According to this embodiment, the sheet remains fixed in the carrier throughout the exposing of both sides. Because such a carrier can be positioned with high accuracy in relation to the optical exposing unit, and because the sheet does not need to be removed from the carrier until the scanning of both sides is complete, it is clear that the images and consequently the printed circuits can be positioned in respect to each other very exactly.

In this single optical exposing unit embodiment, the carrier and the single optical exposing unit may be mutually movable in such a manner that the sheet carried by the carrier can be exposed successively at both sides by the optical exposing unit, for example by scanning using an optical scanning unit. According to an alternative, the carrier may consist of a holder which can be positioned in either two positions in a support mechanism for this holder. The sheet is first fixed in the holder and, in order to expose both sides of the sheet, the holder is first placed into the support mechanism in one orientation. The first side is exposed, and then the holder is removed, turned, and then re-inserted into the support mechanism for the scanning of the second side.

The present invention also relates to a method for scanning a sensitive sheet to be used for a PCB panel, the method being characterized in that during scanning, the sheet is positioned in an upright position. Scanning can be performed from both sides simultaneously, or can be done only from one side. One advantage of this method is that the method can be realized with relatively compact devices, as a horizontal table is no longer required.

The upright construction also provides better accessibility to the optical exposing units. More particularly, in the case of optical scanning units, the arrangement provides good access to the optical heads that are included in each optical scanning unit. Furthermore a completely symmetrical layout is possible.

The present invention also relates to a method for exposing a light-sensitive sheet such as a light-sensitive PCB panel, the method being characterized in that the image of the printed circuit on one or both sides is formed by direct imaging. In this way disadvantages in using phototools such as negatives are excluded.

The present invention also relates to an exposing apparatus having a supporting mechanism for supporting a sensitive sheet and scanning units, more particularly optical scanning units, to perform one or more of the above-mentioned scanning methods. The particular construction of such a device will be clear from the preferred embodiments that will be described herein after with reference to the drawings.

BRIEF DESCRIPTION OF THE DRAWINGS

In order to better show the features of the invention, without any limitation implied therein, several preferred embodiments of the invention are described in greater detail, with reference to the enclosed drawings in which.

DESCRIPTION OF THE PREFERRED EMBODIMENT

Figure 1:
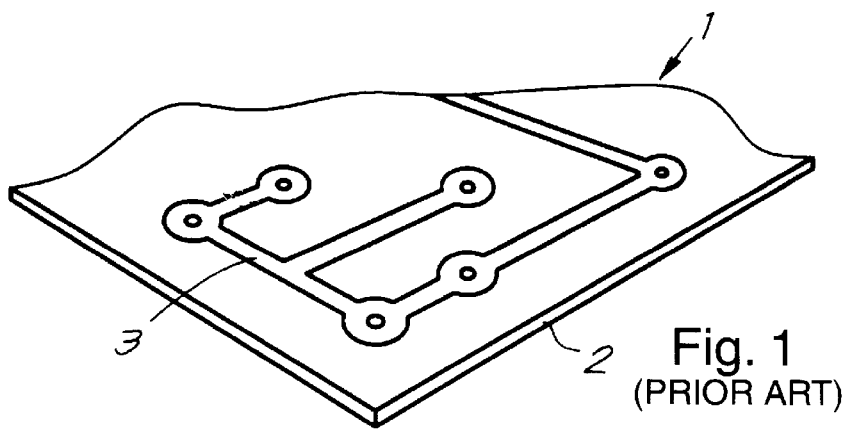
FIG. 1 shows a portion of a printed circuit board (PCB)

As shown in FIG. 1, a printed circuit board 1 generally consists of a board 2 comprising one or more printed circuits, one such circuit shown as 3. A double-sided board has a circuit on each side of a dielectric substrate, while a multi-layer board has several circuits separated by dielectric layers. Feed-throughs, also spelled feed-thrus, and also called vias, are plated-through holes used at desired locations to provide an electrical connection between a printed circuit trace on one side or layer of the printed circuit board and a printed circuit trace on one or more other sides, or on other layers.

Figure 2:
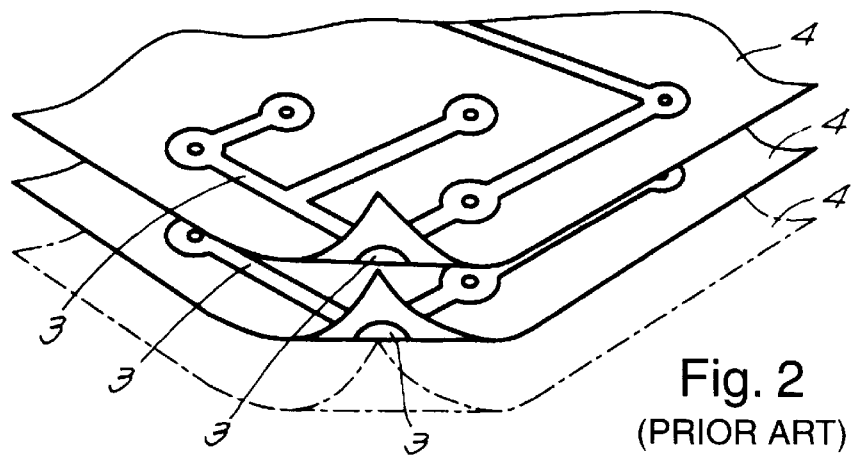
FIG. 2 shows how such a printed circuit board may be composed of a plurality of PCB layers.

A multi-layer board is shown in FIG. 2. Here, printed circuit board 1 is composed of a plurality of PCB panels (each shown having reference numeral 4) that at least one, but preferably at both, sides are provided with a printed circuit. Each of the different printed circuits of PCB 1 uses the same reference numeral 3. Note that the panels are usually rigid, so that the rolling over of a PCB panel shown in FIG. 2 is only for the purpose of illustrating that a PCB panel may have a circuit printed on both sides.

Figure 3:
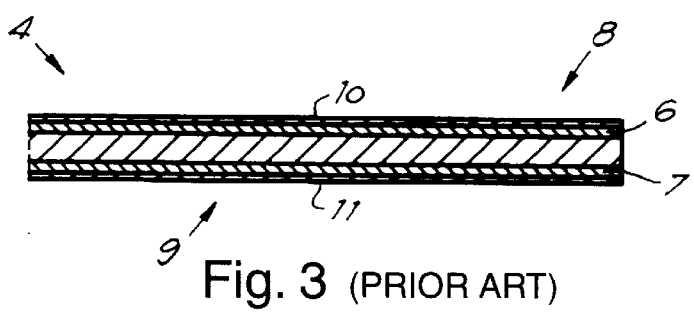
FIG. 3 shows one of the inner PCB panels (or a double-sided PCB) in a cross-sectional view before being exposed or etched.

Prior to the manufacture of the circuit, each of the inner PCB panels 4 starts as a sheet as shown in FIG. 3, comprised of, in the case of a double-sided inner PCB panel, a substrate, electrically conductive layers 6 and 7 at the respective sides 8 and 9 of PCB panel 4, and light-sensitive layers 10 and 11 provided onto the respective conductive layers 6 and 7. Depending on the number of layers of the final board 1, each PCB panel 4 can be relatively thin. A typical PCB panel may have a thickness in the order of 0.1 mm, but may also be considerably thinner or thicker.

In order to realize each of the electrical circuits 3 on each double-sided panel 4, light-sensitive layers 10 and 1I are exposed to light according to the required pattern of printed circuit 3 to be realized. The light exposure may be direct, using for example the device of the present invention, or may use the required phototool of the set of phototools as a photographic mask. Photographic processing of the exposed layers 10 and 11 causes only those parts of the layers to remain that correspond to where conductive paths need to be realized in the particular printed circuit 3. Subsequently, PCB panel 4 is subjected to an etching process in which those parts of the material of conductive layers 6 and 7 which are no longer protected by the corresponding removed parts of light-sensitive layers 10 and 11, respectively, are etched away. This results in conductive material left at the locations necessary for forming the required electrical circuits 3 on each side of PCB panel 4.

Recalling that typically the outer "panels" are metal foils and thus will form only one layer each, and that the inner panels are double-sided, a typical 26-layer PCB would comprise two outer panels (layers number 1 and 26) and twelve inner panels (layers number 2 through 25). Each of the double-sided inner panels would be exposed, processed, and etched and then the inner PCB panels would be laminated with the outer foils. Then the resulting laminated multi-layer panel would be drilled and the holes plated through. Then this panel would be exposed and processed just like a single double-sided inner PCB panel.

Figure 4:
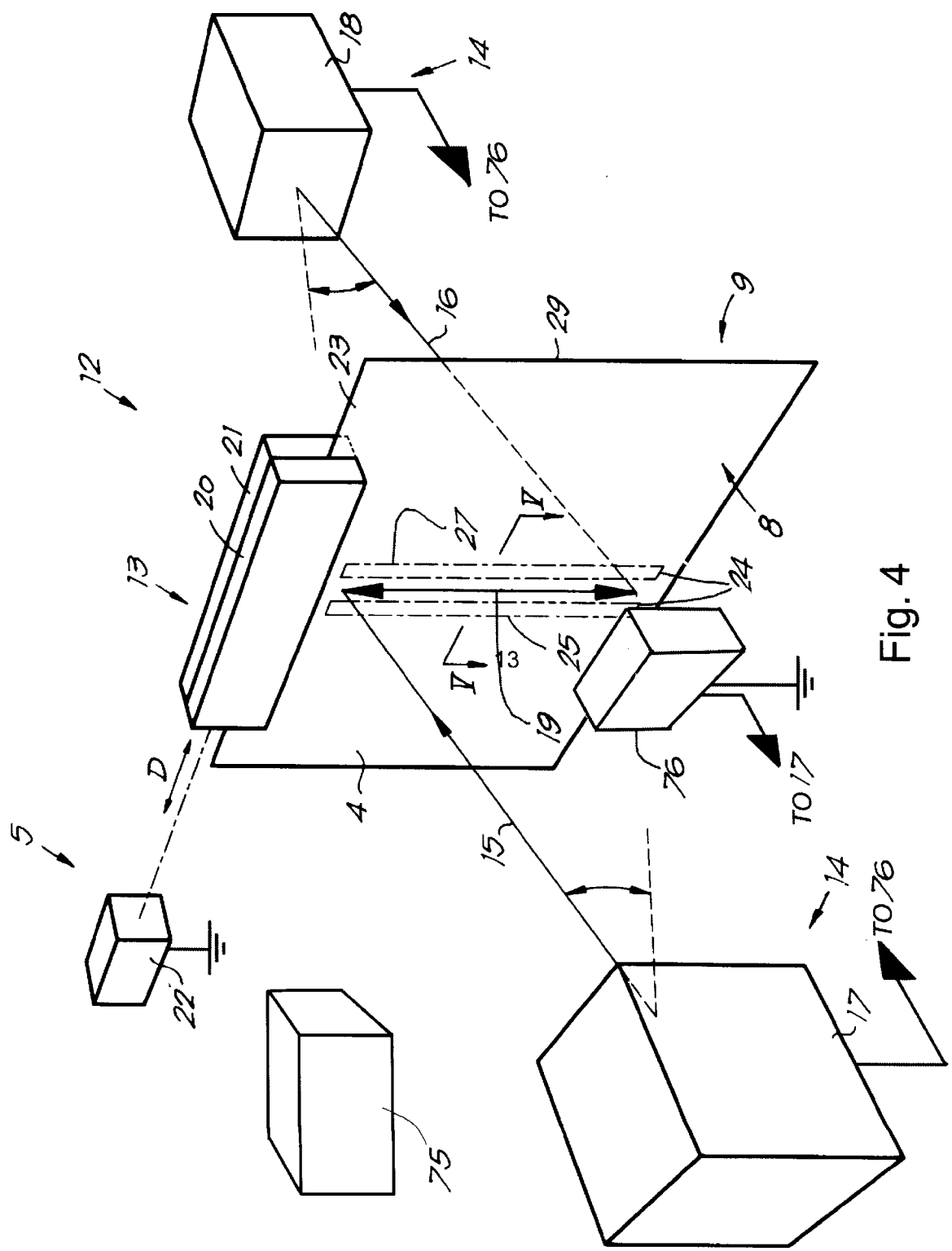
FIG. 4 schematically shows one embodiment of an exposing apparatus according to the invention.

FIG. 4 shows the preferred embodiment of an exposing apparatus 12 that is designed for exposing a double-sided PCB panel. Modifications for other applications would be clear, and such modifications are within the scope of the present invention.

Exposing apparatus 12 comprises a carrier 13 for fixing a sheet thereto. The sheet may be a PCB panel 4 for PCB production, or any other kind of sheet for other applications, for example, a printing plate in the case of exposing a printing plate. Reference numeral 4 henceforth will be understood to mean a PCB panel or any other sheet for exposure by apparatus 12. Exposing apparatus 12 also includes an exposing system, which in this embodiment includes an optical system 14 for direct imaging by ultra-violet light, this causing the light-sensitive layers (layers 10 and 11 of FIG. 3, for example) be exposed to light by means of a scanning movement carried out by two light beams shown as 15 and 16, respectively.

In the particular embodiment shown in FIG. 4, optical system 14 is a dual optical system scanning PCB panel 4 from both sides. This optical system 14 comprises optical scanning units 17 and 18, which include optical heads that direct light beams 15 and 16 towards the respective sides 8 and 9 of PCB panel 4.

Optical units 17 and 18 are preferably located at the opposite sides of carrier 13, thus also at the opposite sides of PCB panel 4. Optical units 17 and 18 cause beams 15 and 16 to move in one plane in such a way that these beams 15 and 16 scan PCB panel 4 form a scan line 19 in a scan line direction on each side of PCB panel 4. In the preferred embodiment, the two scan lines 19 on opposite sides of sheet 4 are located at approximately the same vertical and horizontal locations at each respective side 8 and 9 of PCB panel 4 at any time. Beams 15 and 16 are preferably but not necessarily laser beams, and in the case of exposing light-sensitive PCB panels to be photographically processed, beams 15 and 16 are ultra-violet (UV) light beams produced by one or more ultra-violet lasers, for example, high power ultra-violet lasers (e.g., argon-ion or any other high power laser technology), or low power UV lasers for exposing sensitized layers of high sensitivity.

The detailed description will be for a system in which each of optical units 17 and 18 produces a single beam at a time. How to modify for an alternate embodiment in which each of optical unit 17 and 18 produces a plurality of parallel beams would be clear to those in the art.

Carrier 13 is configured to allow PCB panel 4 to move in a direction D transverse to the scanning direction (i.e., perpendicular to the direction of scan line 19), in such a manner that by the combined scanning movement of beams 15 and 16, and of PCB panel 4 in direction D, the complete surface of PCB panel 4 can be scanned in a raster manner. The direction transverse to the scanning direction (direction D in this embodiment) is referred to also as the transverse direction herein, and the scanning direction is referred to also as the scan line direction herein.

A drive system 5 provides relative motion in the transverse direction between any point on any scan line on the sheet, and the sheet itself. The drive system is configured in combination with the optical system such that each light beam traces a set of one or more substantially parallel scan lines on a side the sheet. All the sets of scan lines for all the light beams for a side cover a desired region on the side of the sheet. In particular, the drive system is synchronized with the optical system such that each light beam traces set of parallel scan lines on each side of sheet 4. Note that as an alternative, the drive system may operate in an open loop manner at a speed determined to produce the necessary scan lines on each side, with a single start signal indicating the location of the panel in the D-direction relative to the scan lines.

It would be clear to those in the art that inherent to providing such relative motion is the requirement that the drive system be coupled to the optical system or to carrier 13 or to both the optical system and the carrier. In the preferred embodiment, the drive system is connected to a frame and includes a drive 22 for moving carrier 13 in the D direction. The preferred system uses a linear motor for drive 22 similar to that described in U.S. Pat. No. 4,543,615 to Van Campenhout et al. incorporated herein by reference. Different linear motor systems, or a motor with a spindle and lead screw mechanism, or any other means for moving the carrier in the transverse direction relative to the optical beams may be used in alternate embodiments.

Various ways of realizing carrier 13 are possible. In the preferred embodiment, carrier 13 comprises a pair of clamps 20 and 21 for holding PCB panel 4, and a drive 22 moves pair of clamps 20 and 21 in direction D. Of course, other forms of the carrier 13 are possible, including using more than two clamps, or using a one-sided clamp that includes, for example, a vacuum system.

The sheet 4 to be scanned is preferably kept in an upright position during scanning as shown in FIG. 4. In particular, PCB panel 4 preferably is fixed, e.g., clamped, at its upper edge 23 and hangs down freely. In this manner the weight of PCB panel 4 helps keep the panel flat. In alternate embodiments wherein the panel is in a horizontal plane, the weight needs to be supported, e.g., on a table, to maintain the sheet flat to prevent bowing in the middle of the panel.

The preferred embodiment can accommodate PCB panels of up to 24 inches in height. The maximum dimension in the D-direction in the particular embodiment is 36 inches.

Figure 5:
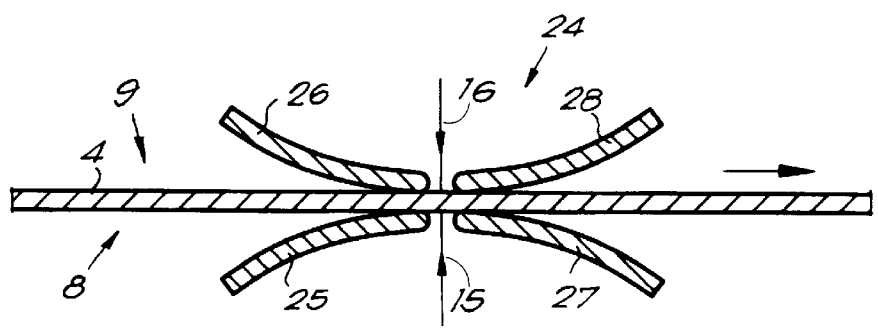
FIG. 5 shows the exposing apparatus of FIG. 4 as the cross-section shown as V—V in FIG. 4.

As schematically indicated in FIG. 4 and shown in detail in FIG. 5, PCB panel 4 will preferably be guided at the location where beams 15 and 16 are projected onto PCB panel 4. To this end, a guiding mechanism 24 is provided. The guiding mechanism is connected to optical system and may be of the contact or non-contact type, and when of the contact type, may be made of any low friction material such as highly polished stainless steel, or coated with a "non-stick" material that has a low coefficient of sliding friction, for example, one or more of a fluoropolymer (e.g., the polytetrafluorethylene TEFLON® from E. I. du Pont de Nemours and Company, Wilmington, Del.), silicone, ultra high molecular weight polyethylene (UHMW-PE) (Crown Plastics, Harrison, Ohio), or a polymer such as nylon. Static dissipative materials may also be added to the non-stick material, for example carbon fibers or carbon powder. Alternatively, rollers may be used for the guiding mechanism. Other implementations of guiding mechanism 24 also are possible as would be clear to one of ordinary skill in the art. One example of a low friction guiding mechanism is shown in FIG. 5, which is the cross section marked V—V on FIG. 4, and which illustrates how in one embodiment, guiding mechanism 24 is comprised of low-friction curved guides 25, 26, 27, and 28 which are located at the opposite sides 8 and 9 and to each side of scan lines 19, and which have a shape designed for easy insertion of PCB panel 4. These provide an air bearing to generate the low friction guidance. Guides 25 and 28 are stationary with respect to optical scanning unit 17, while guides 26 and 28 are stationary with respect to optical scanning unit 18. Note that FIG. 4 only shows one pair of guides marked 25 and 27 of guiding mechanism 24.

Apparatus 12 provides for simultaneous scanning of the two sides of PCB panel 4, so that PCB panel 4 needs to be moved only once in direction D along the projecting planes of beams 15 and 16. "Simultaneously" herein means that the scanning of side 8 is somehow overlapped in time with the scanning of side 9, which does not necessarily mean that beam 15 is switched on or off ("modulated") during the same instant of time as when beam 16 is switched on or off. In the preferred embodiment, one source of light energy is used for exposing both sides of sheet 4, and the activation of beams 15 and 16 is preferably interlaced—one scan line of beam 15 is followed by one scan line of beam 16, and so forth. Other alternatives are possible. Alternatively, two or more light energy sources (e.g., lasers) can be used, at least one for each side, in which case no interlacing is used in order to achieve high efficiency. To enable such scanning of the two sides, a mutual positioning system 76 is provided. Mutual positioning system 76 is connected to the frame and provides for accurately positioning of the scan lines on each side of the panel 4 relative to each other. Each of optical scanning units 17 and 18 is connected to the mutual positioning mechanism. Note that the mutual positioning system is located on both sides of panel 4, and only one side is shown in FIG. 4.

The functioning of exposing apparatus 12, as well as the method applied thereto, can be deduced from the drawings. First PCB panel 4 is fixed in carrier 13. Carrier 13 is connected to drive system 5 which is connected to a frame. Initially, PCB panel 4 is positioned with its leading edge, shown as 29 in FIG. 4, at the guiding mechanism 24. Subsequently clamps 20 and 21 are moved by drive 22 so as to slide PCB panel 4 at a certain speed through guiding mechanism 24. PCB panel 4 is preferably displaced at a constant speed during the scanning, although in other embodiments the motion could be stepwise with small intervals, or in any other manner that provides for generating adjacent scan lines so that a complete image is generated on each side, as would be clear to one of ordinary skill in the art. During this movement along direction D, beams 15 and 16 are moved by the optical units along scan line 19, and during such movements, the beams are modulated (switched on and off) as required by the imaging data describing the pattern of the printed circuit, to expose to light the required areas on light-sensitive layers 10 and 11 in order to create afterwards printed circuits 3 on one or both sides of PCB panel 4.

After exposure, PCB panel 4 can be processed as described in the introduction or in any manner needed for the manufacture of the PCB panel. Note that the processing may be carried out while the PCB panel is still in carrier 13, or in another carrier separate from exposing apparatus 12.

All mechanical movements of device 12 are governed by a controller 75 comprised of a microprocessor, sensors, and special-built electronic hardware. Controller 75 is shown schematically as a single block in FIG. 4. No details such as wiring connections, sensors, etc., are shown. It would be understood by those of ordinary skill in the art that the realization of controller 75 includes such elements. It. also is to be understood that more than one processor may be included in controller 75. The software of the one or more processors in controller 75 (called hereinafter machine software) commands and controls the movements and handles error messages. Some of the control that deals specifically with some aspects of the present invention is described herein. Other aspects are not described herein, and how to incorporate controls into scanning mechanisms is well known in the art.

Figure 6:
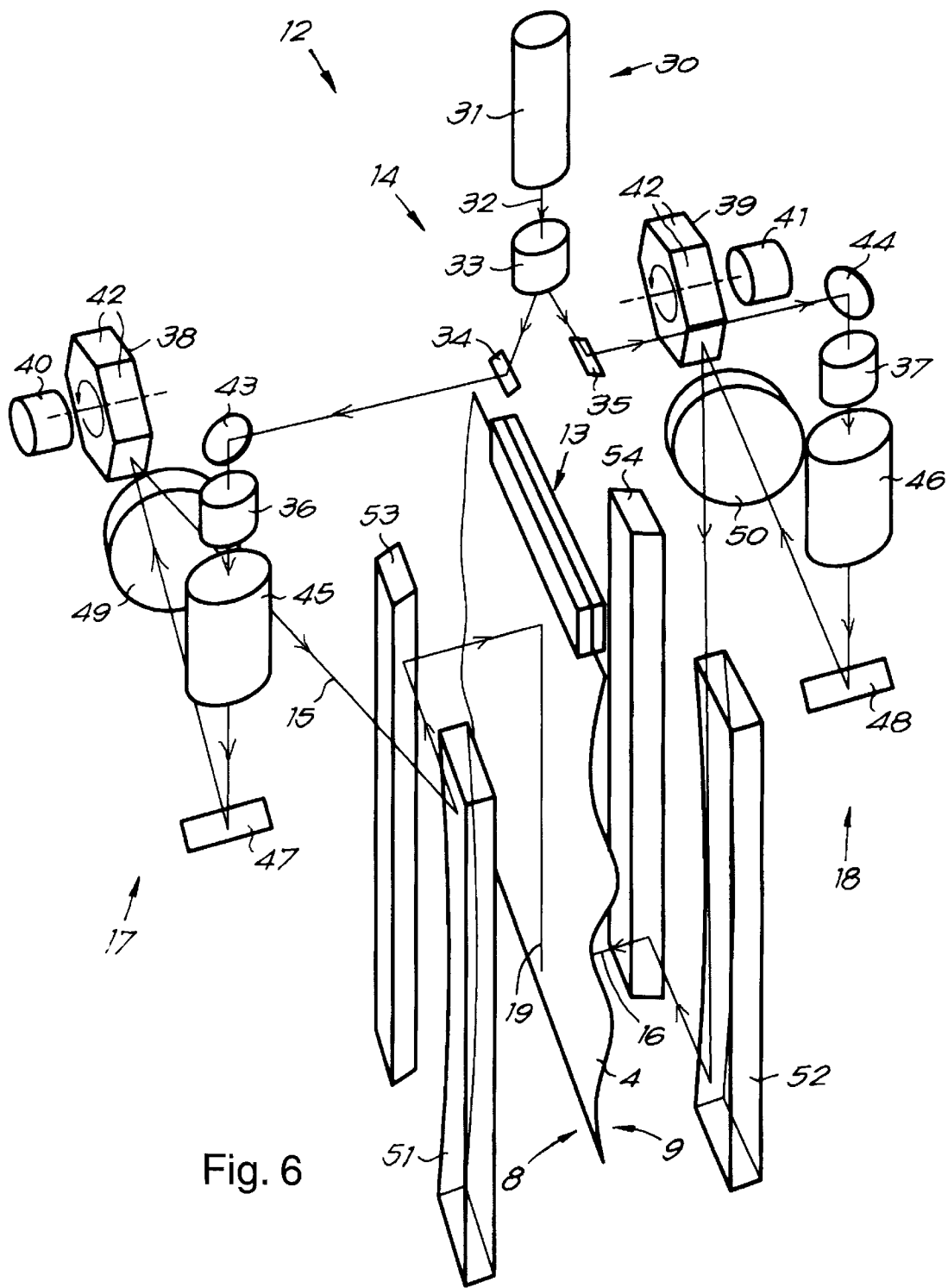
FIG. 6 shows in more detail some of the components of the device of FIG. 4.

As shown schematically in FIG. 6, in the preferred embodiment, only one light source 30 is used for generating both light beams 15 and 16. In an alternate embodiment, the two beams 15 and 16 are each generated from a different light source. That is, two light sources are used, one for each of optical systems 17 and 18.

Returning to FIG. 6, light source 30 of optical system 14 of exposing apparatus 12 includes a laser 31 (e.g., a UV laser) generating a main beam 32 which alternately is directed to optical scanning unit 17 and optical scanning unit 18, with the alternating switching carried out by means of an optical switch 33 acting as a deflector and split mirrors 34 and 35 directed to optical scanning units 17 and 18, respectively. Split mirrors 34 and 35 in the preferred embodiment are two faces of a reflecting prism. Optical switch 33 in the preferred embodiment is a beam deflector, in particular, an acousto-optic deflector made by A.A. Opto-Electronique, St. Remy Les Chevreuse, France.

Other alternatives also are possible for optical switch 33. One such alternative optical switch is a rotating shutter of transparent sections and highly reflective mirror sections, the shutter mounted at 45 degrees, so that at any instant in time, the beam alternately passes through the shutter to be reflected by a mirror to one optical scanning unit, and then is reflected by the shutter to the other optical scanning unit. The motor for rotating the shutter would then be synchronized to the beam scanning units using controller 75. Another alternative optical switch is a deflecting mirror on a fast deflector. Other alternative optical switches that meet the speed requirement may be substituted.

Yet another alternative arrangement would be to use a beam splitter instead of optical switch 33 to produce two split beams, resulting in both beams 15 and 16 being available at each instant of time.

Each of optical scanning units 17 and 18 is now discussed. The scanning units are of such a design that each can produce an accurate scan line of length up to at least $(1.6/\lambda) \times 10^{-7}$ m, where $\lambda$ is the wavelength of the radiation in meters. Thus, for UV radiation at 355 nm, the optical scanning units can produce accurate scan lines up to at least 18 inches in length. In particular, the preferred embodiment scanning units 17 and 18 are designed to be able to scan the 24 inch length of a PCB panel in one scan line of UV light at 355 nm, ie, they roduce an accurate scan line of length up to at least $(2.1/\lambda) \times 10^{-7}$ m, where the wavelength $\lambda$ is in m.

Scanning systems for producing a scanning laser beam have been well known in the art since laser printers and scanners were first introduced in the 1970's. Thus, many embodiments other than that described herein are possible for these optical scanning units. See G. F. Marshall, Editor, *Optical Scanning*, Marcel Dekker, 1991 (ISBN 0824784731) for a discussion of many options. See also L. Beiser and G. F. Marshall, Editors, *Beam Deflection and Scanning Technologies, Proceedings of SPIE*, No. 1454, Febuary 1991.

For example, in accordance with one alternate embodiment, the optical scanning units are of a design that cannot produce a long enough scan line, and several such optical units are used for exposing each side of panel 4. Each produces a scan line, and the optical scanning units are mutually synchronized such that their respective resulting scan lines on any side are stitched together to form a single scan line. See co-owned U.S. Pat. 5,654,817 to De Loor, incorporated herein by reference, for an apparatus that can so stitch several scan lines, and which may be modified to implement such an alternate embodiment.

The preferred embodiment optical scanning units 17 and 18 are now discussed in more detail with reference to FIG. 6. Each of optical scanning units 17 and 18 includes a modulator referenced as 36 and 37, respectively, and an optical head referenced as 38 and 39, respectively. The optical head scans the beam (i.e., generates the scanning motion) in the scan line direction, and preferably is a rotationally driven head. Alternate embodiments may use mechanical deflectors, holographic means, or other mechanisms to generate the beam motion, as is known in the art. See the above referenced Marshall book for such alternatives. Modulators 36 and 37 are optical switches which selectively block or pass beams 15 and 16, respectively, in accordance with imaging data describing the printed circuit to be exposed on either side of PCB panel 4. In the preferred embodiment, acousto-optic modulators (AOM) are used (from A.A. Opto-Electronique, St. Remy Les Chevreuse, France). Other modulator technologies such as electro-optic modulators and deflecting mirrors also may be used. These modulators 36 and 37 are driven by signals generated from a computer system, not shown, the signals indicating when to pass or block the particular beam of beams 15 and 16 according to imaging data describing the PCB pattern to be exposed for the printed circuit.

An alternate embodiment includes only a single modulator between the light source 30 and the optical switch 33.

Optical heads 38 and 39 are rotationally driven in a synchronized manner by means of drive elements 40 and 41, respectively. In the preferred embodiments, electrical motors with appropriate mechanical drive components are used for drive elements 40 and 41. Synchronization is provided by software control using controller 75. Each of pptical heads 38 and 39 includes a polygonal element having reflecting facets 42, such that the light projected onto these facets 42 is reflected in the form of moving light beams 15 and 16, resulting in a movement at PCB panel 4 according to a scan line 19. Optical heads 38 and 39 thus may sometimes be referred to as polygonal mirrors or simply polygons hereinunder. The preferred embodiment uses polygons with six facets per side, and clearly using polygons with a different number of facets also is possible.

Optical units 17 and 18 further comprise several auxiliary elements for guiding the light in the required direction, as well as providing several adjustments. Such auxiliary elements include, for optical scanning units 17 and 18, respectively, beam steering elements 43 and 44, respectively, which preferably are each a pivoting mirror mounted on a piezo-electric element so that the mirror deflects according to a voltage applied to the device (devices from Melles-Griot, Irvine, Calif.). Such devices sometimes also are called galvanometers. Alternatively, acousto-optic or electro-optic devices may be used. Also included in optical scanning units 17 and 18, respectively, are pre-scan optical subsystems which include magnification adjustment elements 45 and 46, respectively, which are beam expanders made from an arrangement of lenses, elliptic mirrors 47 and 48, respectively, and correction lenses 49 and 50, respectively. Optical scanning units 17 and 18 respectively also include post-scan optical subsystems which comprise curved mirrors 51 and 52, respectively, and folding mirrors 53 and 54, respectively. As is common in scanner systems, the pre-scan and post-scan optical subsystems in each optical scanning unit together implement f-theta scan correction and beam focussing, the f-theta correction converting uniform angular rotation of the beam to uniform linear translation of the beam, with the end result being that beams 15 and 16 each form a finely focused spot on the respective sides of PCB panel 4.

Note that while FIG. 6 shows laser 31 positioned above the optical scanning units and generating a vertical beam 32, other arrangements clearly are possible, including a horizontal arrangement above, underneath, or beside the heads 38 and 39.

While many variants are possible, the design shown in FIG. 6 using the beam adjustments and the particular reflective optics described hereinunder provides the required scan line of length at least $(1.6/\lambda) \times 10^{-6}$ m, where $\lambda$ is the wavelength of the radiation in meters. In particular, the preferred embodiment provides for generating a scan line of length up to at least $(2.1/\lambda) \times 10^{-6}$ m, such that when the energy source is a UV laser at 355 nm wavelength, the scan line can be as long as 24 inches. In addition the use of reflective optics in scanning units 17 and 18 provides for using the same optical design for both exposing, and for input scanning.

Although in FIG. 6, the two polygonal mirrors (optical heads) 38 and 39 are shown in identical positions, in practice, for the case of writing in interleaved mode using one light source, they will preferably be out of phase, such that during the period that one head 38 due to its rotational movement is not capable of projecting light to its side of PCB panel 4, the other head 39 can project the light to its corresponding side of PCB panel 4. The functioning of optical switch (deflector) 33 is synchronized with the rotation of heads 38 and 39 such that light is transmitted alternately to unit 17 for one scan line and to unit 18 for a scan line, respectively, in such a manner that at the required periods, light is available at the corresponding head 38 or 39. Like other synchronizations, this synchronization is achieved under control of controller 75.

The functioning of the optical scanning units of device 12 is now described with the aid of FIG. 6 which describes the one beam embodiment. Beam 32 is sent to optical scanning unit 17 half the time (minus the switching time), and optical scanning unit 18 the other half of the time (minus the switching time). In the preferred embodiment, one scan line is generated on one side, then a scan line is generated on the other side of sheet 4, so that the scan lines are interleaved. The imaging data for the modulators in each optical scanning unit thus is input for a scan line on one side, then input for a scan line on the other side of the sheet. In the preferred embodiment, the imaging data for the two sides of the PCB is pre-interleaved to ease the load on the computer system retrieving the imaging data. Clearly, other embodiments may do the interleaving on the fly. Note that such interleaving is necessary for the alternate embodiment of using only a single modular between the light source 30 and the switch 33.

One side only, the side of optical unit 17, denoted side 8, will be described. During those moments that modulator 36 allows the transmittal of light, light beam 15 is projected via split mirror 34, beam steering element 43, modulator 36, and the pre-scan optical subsystem onto facets 42 of the polygonal mirror 38, and from there through post-scan optical subsystem onto one side of PCB panel 4 at points along scan line 19. As each face 42 of the optical head (polygonal mirror) 38 rotates, this light beam 15 during the transmittive instants moves from top to bottom so that spots created on PCB panel 4 due to light beam 15 reaching the PCB panel side move downwards along scan line 19.

Thus in the preferred embodiment, each beam on each side travels from top to bottom. At the moment that the light beam 15 would be projected near the bottom of PCB panel 4 on side 8, the direction of beam 32 is switched by optical switch (deflector) 33 under control of controller 75 towards the optical scanning unit 18, resulting in beam 16 being modulated and following a movement along scan line 19 of the other side of PCB panel 4, denoted side 9. While in the preferred embodiment, the beam on each side travels from top to bottom, other arrangements are possible. For example, one beam, say beam 15 on side 8, may travelling from bottom to top, while the other beam, in this case beam 16 of side 9 would travel from top to bottom. Alternatively, both beams on both sides may move from bottom to top. How to modify the design to accommodate these alternatives would be clear to one of ordinary skill in the art.

These steps are continuously repeated until the required portion of PCB panel 4 is scanned while motion, preferably continuous motion, is provided in direction D.

Beam Adjustments and Synchronizations in Detail

According to a particular aspect of the invention, the scanning movement of light beams 15 and 16 is arranged to both accurately position each of the images (e.g., each of the set of scan lines covering the desired region) created by optical scanning units 17 and 18 on each side, independent of the other side, and also to accurately position each of the images created by optical scanning units 17 and 18 relative to each other. The preferred means of achieving this individual positioning and this mutual positioning (i.e., cross-positioning) is now described with the aid of FIG. 7. The adjustments are made with the help of detection modules 55, 56, 57, and 58 co-operating with optical scanning units 17 and 18. Note that in FIG. 7, no details of optical scanning units 17 and 18 are shown. Rather, these are represented in a schematic way as dotted blocks. It is to be understood, however, that in this embodiment, each optical scanning unit 17 and 18 comprises the different components as described above and in FIG. 6.

Detection modules 55 and 56 are located at one side, say side 8 of PCB panel 4, below the lower, and above the upper edges, respectively, of this side 8 of PCB panel 4, and are capable of measuring aspects of the beam on this side 8. In particular, these detectors are each capable of measuring deviations of beam 15 in both the cross-scan direction (direction D) and in the in beam direction. Because the scan direction is from top to bottom, module 56 is a start of scan (SOS) detection module, and module 55 is an end of scan (EOS) detection module, each measuring deviations in the cross-scan and in beam directions at the start and end of scan, respectively. Similarly, detection modules 57 and 58 are located at the other side, side 9, of PCB panel 4 below the bottom and above the top, respectively, of PCB panel 4, and form the end of scan and start of scan detection units, respectively, of side 9. In this particular embodiment, referring again to FIG. 7, optical scanning units 17 and 18 and the operating detection module pairs 55 and 56, and 57 and 58, respectively, are provided on carriages 59 and 60, shown in FIG. 7 in dotted outline form, and which can be slid apart from each other and back together by movement in direction E in order to facilitate the insertion of PCB panel 4 and to accommodate different panel thicknesses. The mechanical coupling of the detection units on each side to the optical scanning units of each side enables the detection modules to be kept in focus for the beams on that side independent of the thickness of the panel. Clearly, according to an alternative embodiment, optical scanning units 17 and 18 and the corresponding detection module pairs 55 & 56 and 57 & 58, respectively, may also be arranged in a fixed position.

For each of sides 8 and 9, detection module pairs 55 & 56 and 57 & 58, respectively are used in conjunction with optical scanning units 17 and 18, respectively, in order to carry out several adjustments to the scanning beam patterns on the respective side to ensure that the scanning patterns are accurate on each side. Such adjustments are carried out by adjusting beam steering elements 43 and 44, respectively, of optical scanning units 17 and 18, respectively, in order to obtain correctly projected images onto sides 8 and 9 respectively.

Only some of the most important adjustments are described herein. Other adjustments are known in conventional laser scanner design. See the above mentioned Marshall book for examples.

Rotation of the Scan Lines

The relative movement of the PCB panel 4 and the optical scanning units causes the scanning paths to be not perpendicular but inclined in the opposite direction of the movement of the PCB panel 4 indicated bydirection D. In an improved embodiment, the scan lines on each side are made perpendicular by slightly rotating each optical scanning unit with respect to direction D. This can be achieved by rotating the optical units, or by slightly inclining the panel, or by using beam steering elements 43 and 44. The rotation is by an amount to make the scan lines perpendicular to the motion, and thus may be tied in to the speed of motion in the D-direction, which depends on the number of beams and the spot size of the beam. Another method which can be combined with the mechanical inclination method, or used alone, is to adjust the start of the scan to first pixel timing, in correspondence and in synchronism with the transport of PCB panel 4 in the D-direction. This has the advantage of adapting easily for different resolutions and different numbers of beams compared to the method mechanical inclination. The speed of the board is adapted so that when the next scan line comes on the same side, the beam touches the previous line. That is, the board will move by the separation of two scan lines, between the starting moments for two consecutive scanlines on the same side of the board. The speed of motion in the D-direction is dependent on the rotational speed of each polygon, and is also locked to each polygon's speed. The correction for the rotation of the scan-lines is sometimes referred to as parallelogram correction herein.

Cross-Scan Variations

Adjustment of the scan lines to coincide with the nominal (desired) scan lines to correct for cross-scan variations uses beam steering elements 43 and 44 in conjunction with the start of scan and end of scan detection modules on each side. Beam steering elements 43 and 44 preferably are each a pivoting mirror mounted on a piezo-unit, such that the pivoting of the mirror on beam steering element 43 (and 44) causes the outgoing scanning beam to deflect with respect to the incoming scanning beam. This deflection will then cause the scan beam to shift thus enabling an alignment of the scanning beam with respect to the scanning path 19 on the PCB panel 4 in the cross-scan direction. Part of the cross-scan correction operates in a feedback loop system during exposure and other parts use open loop correction using compensation tables obtained by calibration. The cross-scan correction also compensates for temperature variation, since this is a slow process and the scan beam is always referred to the detection module position which typically may be assumed to be in a stable relative position during exposure. That is, when for example, PCB panel 4 expands because of a rise in temperature, mounts 59 and 60 will expand by the same amount. This guarantees that the length of the scan line on PCB panel 4 scales with temperature which is required in PCB production because the different layers in a multi-layer PCB board will be used at the same operating temperature.

One cross-scan correction system is described in co-owned U.S. Pat. No. 5,654,817 to De Loor, which describes a single-sided laser scanning system. The cross-scan correction used herein adds a feature of correcting for any bow in the beams. That is, a correction is included for correcting any deviations of the beam from a straight line due to any imperfections in optical scanning units 17 and 18, which in this embodiment are capable of scan lines of up to 24 inches.

Figure 8:
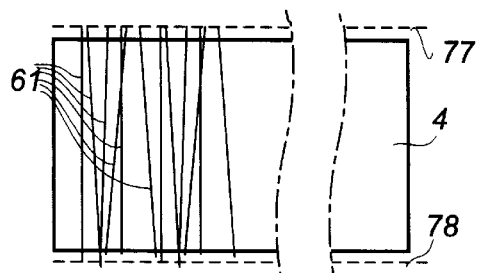
FIGS. 8 to 11 shows changes in the scanning patterns produced by some of the adjustments.
Figure 11:
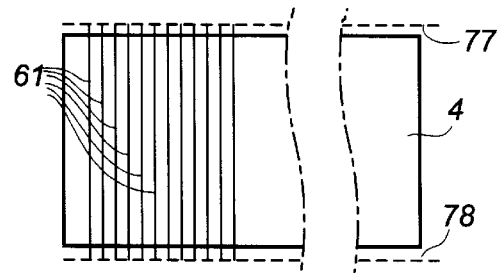

The effect of a cross-scan deviation is illustrated in FIG. 8 which shows a set of scan lines 61 prior to correction on one of the sides, side 8. The lines are inclined in several directions due to polygon facet surface angle and positional variations, which lead to cross-scan variations. The lines also are of different length. The detection modules are placed above and below PCB panel 4. Dotted line 77 shows the positions of the start of scan (SOS) detection module 56 on side 8 and (and start of scan unit 58 on side 9) during the motion in direction D, while line 78 shows the positions of end-of-scan (EOS) detection module 55 on side 8 (and end of scan module 57 on side 9) during the motion. FIG. 11 shows the scan lines 61 as they should be after correction. Any inclination of the scan lines due to continuous motion in the D-direction is not shown because the inclinations are either corrected for as described above, or are very small. Also not shown is any bowing of the scan lines. The cross-scan variations shown in FIG. 8 may be expressed in terms of the deviation from nominal scan lines at the start of scan detector position 77, denoted Δhb, and the deviation from nominal scan lines at the end of scan detector position 78, denoted by Δhf. The cross-scan deviation is preferably measured at the starting and end points of the segment using the cross-scan detection parts of the SOS and EOS detection modules, and correction at any point along the beam is determined by interpolation. The scanning beam is shifted and/or rotated as required for correction by means of beam steering element 43 (and unit 44 on side 9) in order to force the actual beam on to the nominal path. This is separate from correction for the bowing effect, which may be carried out by calibration scans which measure scan line deviations at many points, these measurements then used to create bowing effect compensation tables which also drive beam steering element 43 (and unit 44 on side 9). Thus, the system corrects for equal start and end positions on each scanline, and then applies the correction function using the bowing effect compensation tables.

Note that instead of using detection modules for detecting the cross-scan variations of the scanning beam on each side, in alternate embodiments it would also be possible to superimpose light of a different wavelength on the scanning beam and detect that different wavelength which would not influence the scanning. This, for example, would help deal with detectors that respond poorly or degrade with UV. Thus, a green laser may be used in combination with a UV filter in front of detectors which are more sensitive to green light.

Note that in the preferred embodiment, SOS detection module 56 uses a mirror 63 for detecting start of scan of side 8 and start of scan detection module 58 uses a mirror 65 for side 9. Similarly EOS detection modules 55 and 57 use mirrors 62 and 64, respectively for detecting the end of scan on sides 8 and 9, respectively. Using the mirrors for the detection units means that detector modules for any side are placed in front of PCB panel 4 for proper focus by redirecting the laser beam towards the detectors using those mirrors. Other arrangements clearly are possible.

Figure 13:
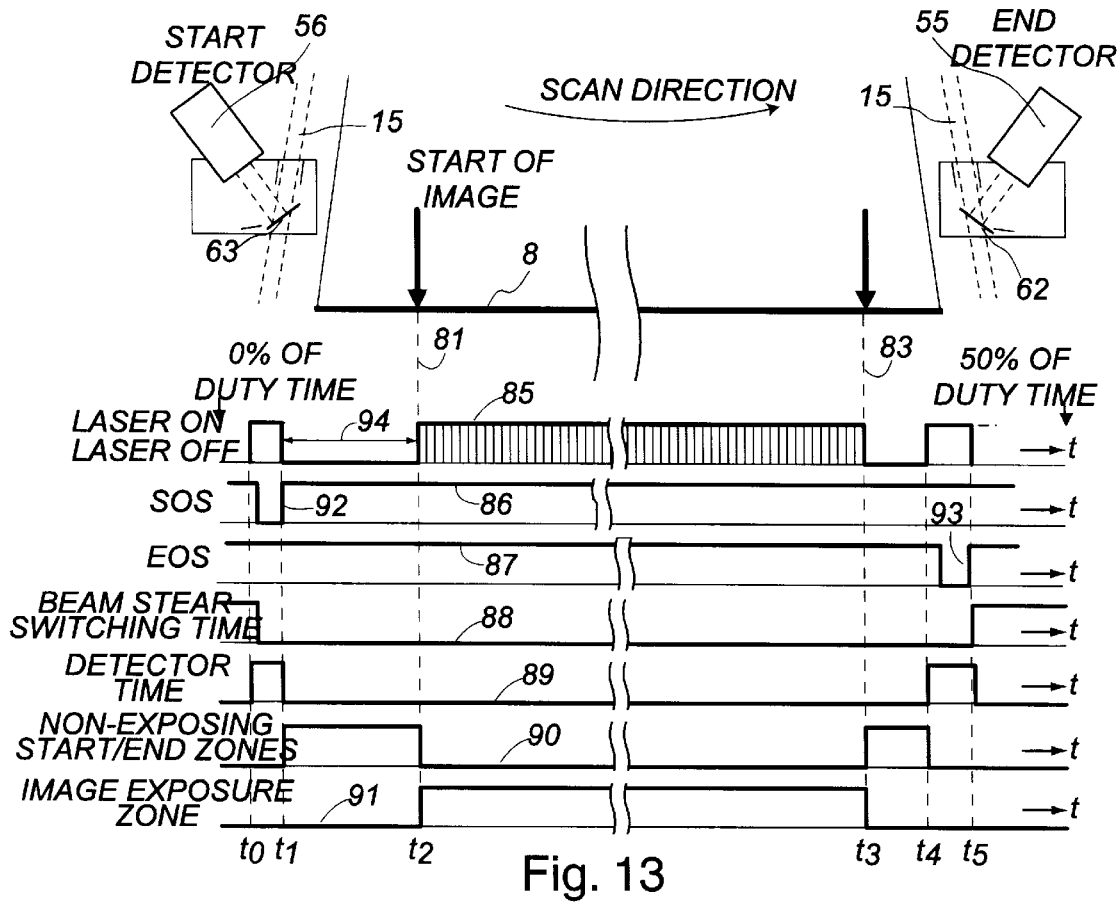
FIG. 13 shows the timing of a scan on one side of a PCB panel.

Because of the preferred placement of the detection modules, optical scanning units 17 and 18 are arranged in such a manner that the outgoing scan beam covers a path which is a little bit longer than the length of the PCB panel which can be up to 24 inches in the preferred embodiment. The scanning of one side, in this case side 8, of PCB panel 4 is illustrated in FIG. 13 which also includes several timing diagrams. Beam 15 of optical scanning unit 17 scanning side 8 reaches the end of image point 83 of scan line 19 at the time shown as $t_3$. Scanning beam 15 continues to travel and reaches the end of scan detector module 55 (on side 8) positioned on line 78, at which point in time (this time shown as $t_5$), the scan line direction detection part of EOS detection module 55 detects that scanning beam 15 has reached its end point. Scanning beam 16 of optical scanning unit 18 on the other side (side 9) now starts the scanning of side 9 and such beam 16 reaches the start of scan detection unit 58 along line 77 before reaching the start of image position on side 9 of PCB panel 4. The preferred synchronization is that the switching of the laser beam from optical unit 17 to optical unit 18 occurs after time $t_5$ and that the scan line 16 on side 9 reaches its start of image position exactly one half pixel with distance in the D-direction from the position of the scan line on side 8. The start-of-scan scan line direction position and cross-scan position of a beam for any side are detected by the SOS detection module of that side.

The Detection Modules

Figure 14:
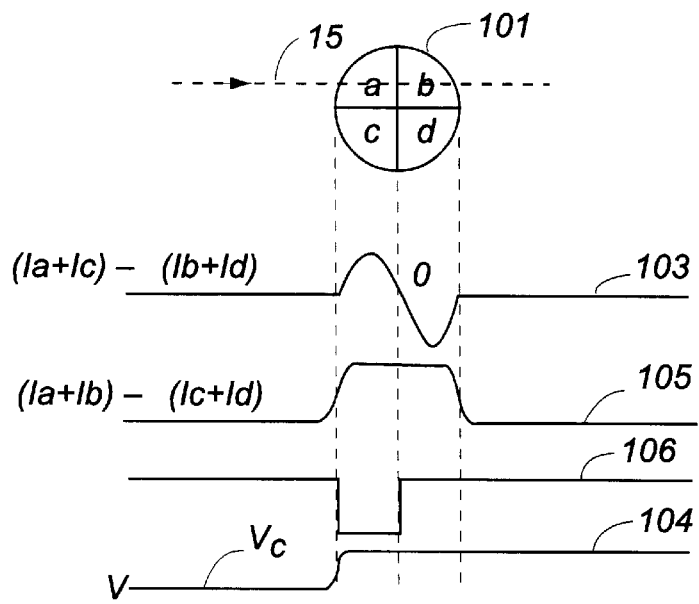
FIG. 14 shows the timing of signals from a four quadrant diode as used in the preferred embodiment in each of the detection modules.

Each detection module is capable of measuring the cross-scan deviation and the in beam variation. In alternative implementations, separate detectors may be used for the in-beam and the cross-scan variations. Another aspect of this invention is the use of detection modules that are 1) sensitive to the cross-beam deviation, 2) can generate a pulse at a particular location in the in-scan direction when the beam crosses that location, and 3) are relatively insensitive to the focus of the beam. One implementation for each of detector modules 55, 56, 57 and 58 comprises a four-quadrant photodiode cell. One such detector, in this case a circular one 101 is illustrated in FIG. 14, and other shapes may be selected to achieve desired properties as described below. Referring first to FIG. 14, a four-quadrant photodiode cell (available in various shapes, for example, from Hamamatsu Photonics, K. K., Hananatsu City, Shizuoka Pref., Japan, or made to order) enables determining the cross-scan deviation value of the relevant incident beam by subtracting the bottom photodiode currents ($I_c+I_d$) of quadrants c and d from the top ($I_a+I_b$) currents. Such an arrangement using a differential signal is insensitive to the beam width and beam energy. When ($I_a+I_b$)−($I_c+I_d$) is zero, the beam is centered along the line between the top and bottom quadrants. Curve 105 of FIG. 14 shows this crossscan signal as indicating that beam 15 is off-center towards the a and b quadrant side. The cross-scan deviation can thus be determined by measurement. In the present example curve 104 in FIG. 14 illustrates the cross-scan deviation signal such as sampled by the sampling pulse 106. Sample pulse 106 is generated by the beam passing either quadrant a or c of diode 101. The sampled value $V_c$ corresponds to the deviation of Δhb at the approximate start of the scanned segment. The sampled deviation value Δhb will then be supplied to the scanning beam steering elements 43 in order to compensate for the cross-scan deviation and minimize the latter. Similarly, Δhf is measured and used in correction.

The four quadrant photodiode detection module also is capable of determining position in the scan line direction. Referring to FIG. 14, the generated scan line direction positioning pulses (the first and second pulses), an example of one of which is shown as curve 106, are such that the down-going edge of each pulse coincides with the moment at which the light beam reaches one of the quadrants a or c, and the up-going edge with the moment at which the spot crosses the separation between the quadrants a and b or between c and d. The result of (Ia+Ic)–(Ib+Id) is shown by curve 103 which is symmetrical with respect to point 0 which is at the interface of quadrants a and c and quadrants b and b. Point 0 may thus be used as a reference point in the scan line direction position. Timing pulse 106 may then be generated in which the down going edge indicates the point in time when the beam hits either quadrant a or c, and the rising edge indicates the point in time when the beam passes the reference point (the line separating a and c, and b and d). Of course a pulse with opposite polarity alternatively might be generated.

Figure 21A:
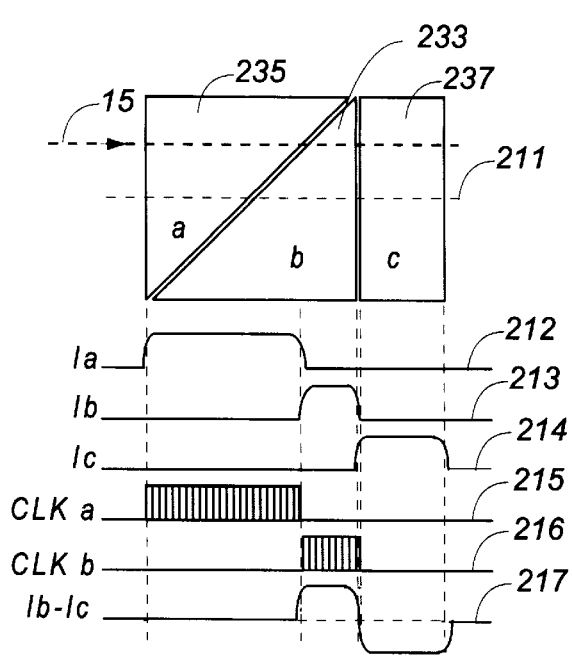
FIGS. 21A–21F show several alternative configurations of detection modules capable of cross-scan deviation measurements and timing according to another aspect of the invention.

Alternate shapes to that shown in FIG. 14 also may be used for generating a differential signal insensitive to beam width (i.e., to focus) to indicate the cross-scan position, and such diode shapes may be preferred for some applications. FIGS. 21A–21F show several possibilities, each using two or more photodiodes. In one such example, shown in FIG. 21A, two triangular photodiode elements which together form a rectangle may be used, and such a shape allows one to measure cross-scan deviations linearly and thus to also determine off-center positions. A front triangular photodiode element 235 (diode a) is combined with a rear triangular photodiode element 233 (diode b). When beam 15 is centered in the cross beam direction, the center location shown by center-line 211, the beam traverses equal lengths in both diodes 235 and 233 so that integrating and subtracting the total current in the diodes (Ia–Ib) gives a signal that is zero. When the beam (beam 15 in this case) is offset, as shown in FIG. 21A, the beam traverses a longer path in photodiode a than it does in photodiode b, as shown by the longer length of pulse Ia (curve 212) and the shorter length of pulse Ib (curve 213). With the arrangement shown in FIG. 21A, both the difference between the lengths of paths traversed in diodes 235 and 233, and the integrated difference in the currents, (Ia–Ib), are linear with the cross-scan position. In one implementation, this difference is converted to a voltage using a differential integrator. Since in the preferred embodiment of the optical scanning units, each beam travels at constant linear speed, the difference in traversed lengths in the two photodiode elements 235 and 233 can be converted into a timing pulse with a duration proportional to the traversed length. The length of these pulses can be determined by a high frequency clock, a count of which is triggered by when the rise in the current pulses and completed when the diode current goes down. The difference between the two counters is proportional to the difference in the path lengths traversed by the beam, and thus varies with the cross-scan position. These clock pulses are shown as curves 215 (CLK a) and 216 (CLK b) for the photodiode elements a and b, respectively. If, for example, it is desired to offset a scan line over a distance ΔD/2, an easily determined relationship exists between the distance ΔD/2 and the number of counts in the difference, and such a relationship can be used for the offsetting. As will be described later, for accurate cross-scan positioning, beam steering units 43 and 44 are biased to obtain the correct number of counts (positive or negative) in the difference of the two counters. Biasing until a desired positive count steers the beam upwards in FIG. 21A, while achieving a desired negative count steers the beam downwards in FIG. 21A. Note that a main feature is the relative insensitivity to beam diameter variations, and thus to focus. If the beam spot is for example larger, the rising edges of curves 212 and 213 would be less sharp, and the start point will be shifted to the left. However, the falling edges also would be less steep when the beam leaves a particular diode's zone, so the cross-scan position, as measured by the difference in the number of pulses in "CLK a" and "CLK b" would remain substantially the same as for the smaller beam spot.

In order to increase the accuracy, it is desirable for the traversed lengths, and hence the clock counts, to be high. For this reason, the dimensions of photodiode elements 235 and 233 are such that the face of a in the cross-scan direction is about four times less than the longest dimension in the scan beam direction. Thus, FIG. 21A is drawn out of scale in order to emphasize structure. In the preferred embodiment, the edges shown in FIG. 21A to be horizontal are longer than the edges shown in FIG. 21A as vertical. Note that the beam scan direction is horizontal from left to right in FIG. 21A.

For timing pulse generation, the front edge of a photodiode a may be used, since this edge is in the transverse direction, and in this application, beam timing always occurs for a focussed beam. However, in the implementation shown in FIG. 21A, for timing determination, a third detector element 237, preferably with rectangular shape, is added behind the rectangle formed by the two triangles 233 and 235, preferably with the surface area of the rectangle being equal to the surface area of each triangle in order to have equalized electrical characteristics (e.g., capacitance) for all three photodiodes. The interface between back triangular diode 233 and rectangular diode 237 is perpendicular to the beam direction, so that the pulse (Ib–Ic) shown as curve 217 in FIG. 21A always crosses zero when the beam crosses the interface. This provides a source for a timing pulse in the scan line direction.

Figure 22A:
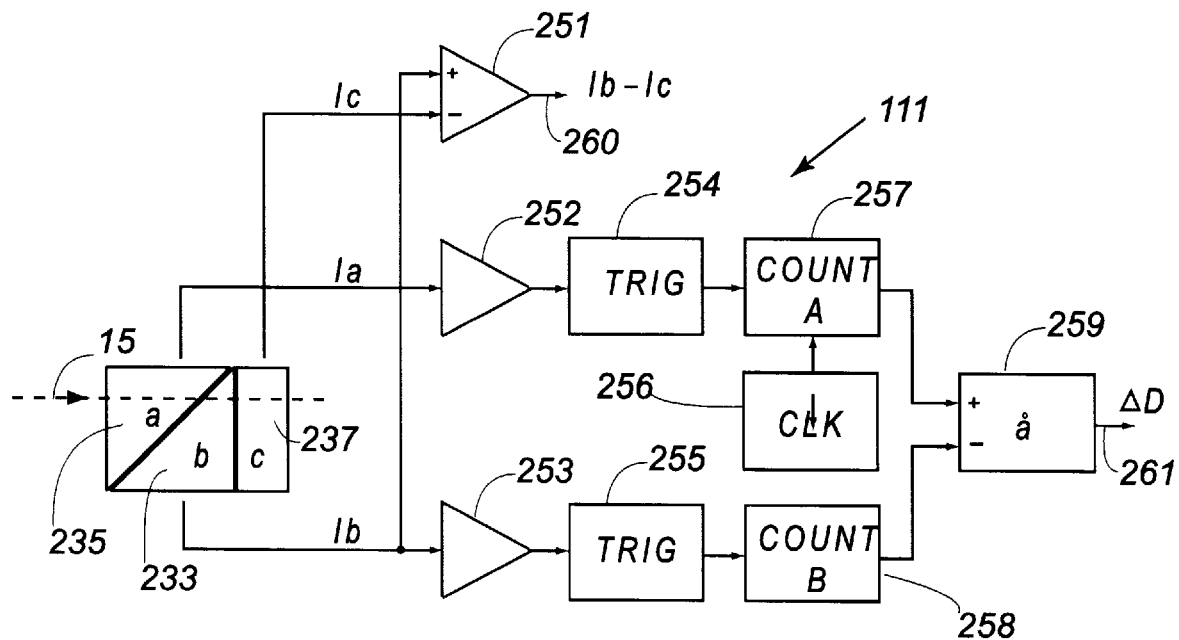
FIGS. 22A and 22B show two variations of a circuit useful for determining cross-scan variation and a beam timing pulse which may be adapted to be used with any of the modules of FIG. 21A–21F according to another aspect of the invention.

FIG. 22A shows a simplified block diagram of a circuit for interfacing the detection module of FIG. 21A. Preamplifiers 252 and 253 are coupled to photodiodes 235 and 233, respectively, and each preamplifier output is used in TRIG modules 254 and 255, respectively, to determine a start trigger pulse edge when the beam starts and a stop trigger pulse edge when the beam stops traversing the corresponding photodiode element 235 and 233, respectively. These trigger pulse edges are used to start and stop counters 257 and 258, respectively, which are driven by a high frequency clock shown as CLK block 256. While a single signal line is shown coupling the TRIG unit (254 or 255) and the counter (257 or 258), it would be understood by those skilled in the art that this representation is schematic, and a separate signal line may be used for the start and the stop pulses. The output of the counters after both counters have stopped counting is coupled to a subtraction unit 259 to generate a signal which may be calibrated to give a value indicative of the deviation DD of the beam (15 in this case) from the center line. Subtraction unit 259 may be a separate digital subtractor, or, as in the preferred embodiment, an instruction implemented in controller 75.

FIG. 22A also shows a differential preamplifier 251 coupled to photodiodes 233 and 237 (diodes b and c) to provide the pulse (Ib–Ic) from which a timing pulse is generated for determining when the beam crosses the interface between diode b and diode c, this interface being in the transverse direction so that the timing pulse is independent of the location of the beam in the cross-scan direction.

Figure 21B:
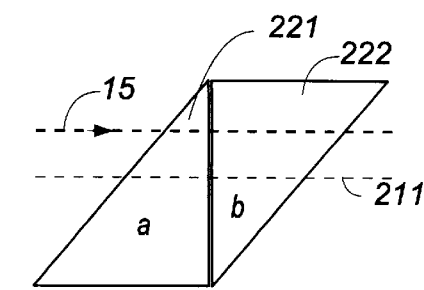

FIG. 21B shows an alternative arrangement using only two diodes 221 and 222 to determine both the cross beam location and the timing pulse when the beam crosses a particular point in the scan line direction, again the detection module configured so that the cross-scan position determination and the scan line timing determination are substantially insensitive to beam focus. Again, when the beam shown as beam 15 is at the center line 211, the beam traverses the same distance in photodiodes a and b so that the differences of the traversed lengths or integrated currents is zero. The same circuit as shown in FIG. 22A may also be used with the detection module of FIG. 21B, with diode a (221) coupled to both preamplifier 252 as shown, and to the positive input terminal of differential preamplifier 251 (which in the figure is shown coupled to diode b). Diode b (222) would be coupled to both preamplifier 253 as shown, and to the negative input terminal of differential preamplifier 251 (which in the figure is shown coupled to diode c). The operation of the circuit would be the same.

Figure 21C:
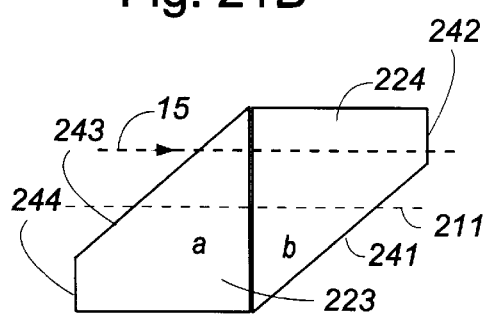
Figure 21D:
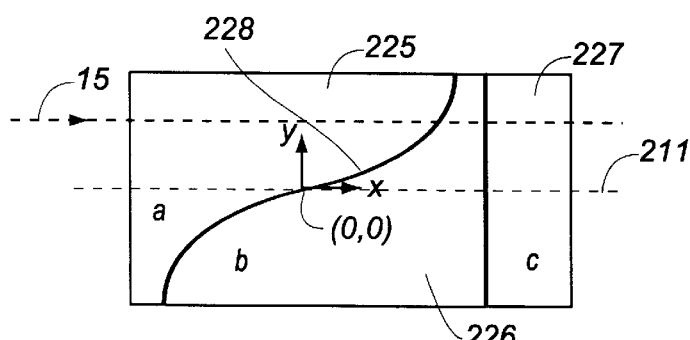
Figure 21E:
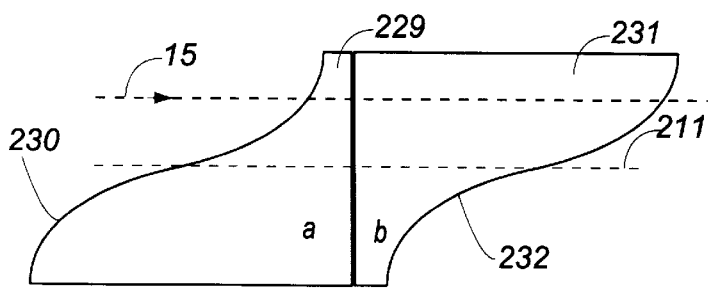
Figure 21F:
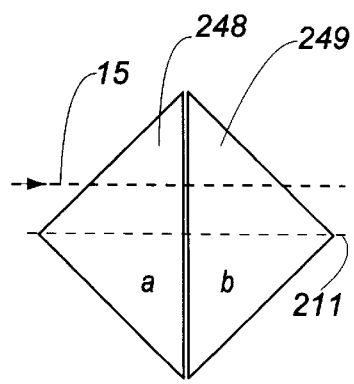
Figure 22B:
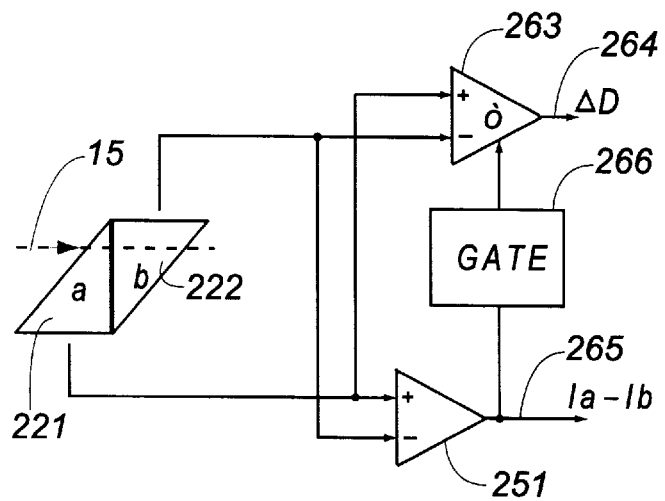

An alternative circuit applicable to all the diode shapes shown in FIGS. 21A–F, and easily modifiable to the four quadrant detection module shown in FIG. 14, is shown in FIG. 22B coupled to the detection module of FIG. 21B. The operation of differential preamplifier 251 is identical to the operation of the preamplifier 251 in FIG. 21A, except of course, Ia–Ib is determined for determining the timing. The output of this differential preamplifier also is used in GATE circuit 266 to determine the start of when beam 15 hits the front edge of diode a (221) and the end of when the beam leaves the rear edge of diode b (222). This start and this end are respectively the start and end of integration of a differential integrator 263 which determines the integrated difference between the diode signals from the front diode a and the rear diode b. This integrated output 264 is indicative of the deviation of the beam position from the center line position, and thus may be calibrated to indicate deviation $\Delta D$. The output then can be used to bias the beam steering units on either side of PCB panel 4 to provide accurate cross-positioning (i.e., mutual positioning) in the cross-scan direction.

FIG. 21C shows an improved version of the dual photodiode detection module of FIG. 21B in which the variation of the integrated output or pulse count difference, rather than being linear with deviation of the centerline as in the case of FIGS. 21A and 21B, is piecewise linear, with greater sensitivity close to the centerline, and less sensitivity further away from the centerline. This arrangement permits a greater dynamic range of deviation to be achieved with the same components.

FIG. 21D shows a variation of a three diode configuration where the back edge of the front diode a (225) and the front edge of the back diode b (226) follow a curve 228 which is adapted to provide an indication of cross-scan variation with high dynamic range and high sensitivity with close to a linear relationship for beams close to is centerline 211. For diodes a and b forming a rectangle of a shorter dimension in the transverse direction than in the scan line direction, with the centerline being the origin 0,0, and y indicating the cross-scan direction, and x the in scan direction, the particular shape of curve 228 of FIG. 21D is $$x(mm)=0.4420*erf[y(mm)/0.1247]$$

for y in the range of ±0.25 mm. Other curves having similar properties clearly are possible and all are within the scope of the invention.

Note that using such a shape for the edges provides for a cross-beam region of higher sensitivity and a cross-beam region of less sensitivity to cross-scan position.

However the regions merge such that there is no distinct boundary therebetween.

FIG. 21E shows a two diode variation using the same curve on edges 230 and 232 of diodes 229 and 231 as edge 228 of FIG. 21D.

The configurations of FIGS. 21A–21E all have in common that they are sensitive to the direction of cross beam variation. The two-diode configuration shown in FIG. 21F is sensitive to the absolute value of the deviation of beam 15 from centerline 221.

Note that while the preferred embodiments of the above-described detector modules are built using photodiode cells, other photo-detector cells also may be used. For example, it may be that in the future, detector technologies other than photodiodes may become available. The inventive aspects of the detector modules are in the way the two or more photo-detector cells are combined, and not in the particular technology of the cells used in the herein-described embodiments (photodiode cells).

The Cross-Scan Correction Control System

Figure 9:
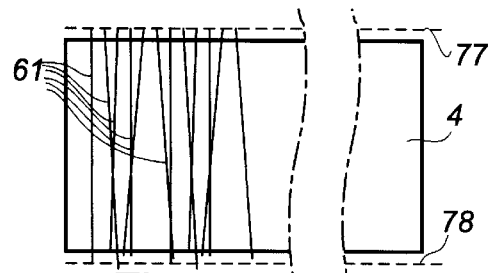
Figure 10:
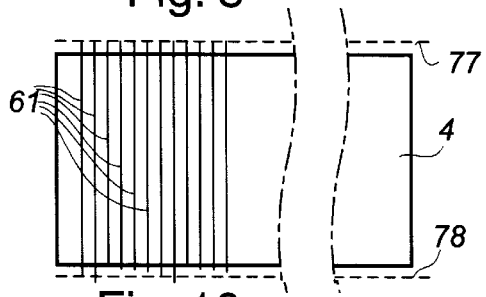

FIGS. 9 and 10 describe some of the problems that need correcting. FIG. 9 shows results of equalizing the start of beam variation $\Delta hb$ on each start of scan. All the scan lines on the side start correctly (equally spaced at the nominal scan lines). However the scan lines 61 are still skewed in FIG. 9. FIG. 10 shows the results of also correcting the end of scan deviation $\Delta hf$ so that the scan lines are now straight and equidistant. How to achieve the corrections that produce FIG. 10 will now be described.

The errors shown in FIG. 9 likely are because of deviations in the facet angles of each polygon, so cross-scan deviation correction for the end point of the scan lines after the start points are corrected is called facet angle correction herein.

Figure 15:
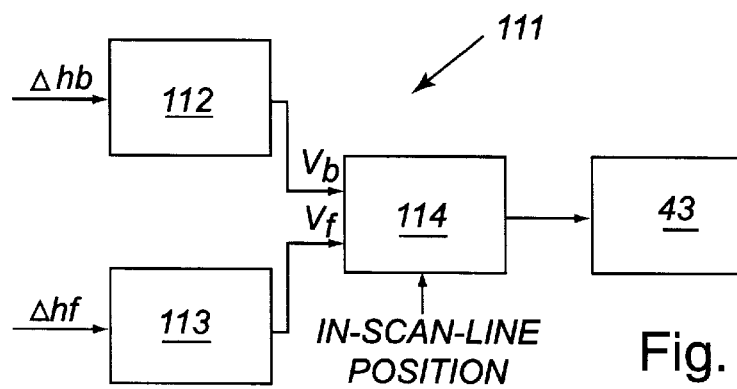
FIG. 15 shows a block diagram of an embodiment of a control circuit used for these beam steering corrections.

FIG. 15 shows a block diagram of an embodiment of a control circuit 111 used for these beam steering corrections, one such circuit for each optical scanning unit. Controller 75 is used to implement control circuit 111. For the sake of explanation, the functioning of controller 111 will be explained for adjusting one side, say side 8 using detection modules 55 and 56. The deviation values $\Delta hb$ and $\Delta hf$ such as determined by detection modules 56 and 55, respectively are supplied to a first proportional-integral-derivative (PID) controller 112 and a second PID controller 113, respectively. PID controllers 112 and 113 generate control voltages $V_b$ and $V_f$, respectively, on the basis of the values $\Delta hb$ and $\Delta hf$. $V_b$ and $V_f$ represent the cross-scan control voltage at the starting and the end points, respectively, of a scan line 19 on side 8. The output of both PID controllers are coupled to the inputs of an interpolator 114 which receives a scan line direction position signal at a control input indicating the spot position along the considered scan line. The interpolator then interpolates between the control voltages $V_b$ and $V_f$ in order to form an interpolated signal, which forms a first correction signal. The interpolated voltage is supplied to the beam steering element 43. That is, in the preferred embodiment in which a mirror and a piezo-unit is used, the mirror pivots under control of the first correction signal in order to reorient the beam and minimize the cross-scan deviation between the actual scan line and the nominal (i.e., desired) scan line.

In one embodiment, in which correcting for the bow in the scan lines is carried out separately, the interpolation carried out by interpolator 114 is a linear interpolation. In an alternate embodiment, interpolator 114 may fit a previously determined compensation table between the control signals $V_b$ and $V_f$, in which case the signal shown as "IN-SCAN-LINE-POSITION" may be provided with the table value at any intermediate value.

FIG. 10 shows the scan lines after all the cross-scan correction.

Cross-Scan Correction: Alternatives

In the preferred embodiment, erroneous start of scan and end of scan cross-scan may be caused by inequalities in each of the six facets on each of the polygons (for the six-facet polygons of the preferred embodiment). In an alternate implementation, instead of the control system, one can use fixed compensation tables that provide for signals for each beam steering device at the start of scan and end of scan positions for each facet for each polygon. Prior to use (and at frequent intervals) the system is calibrated to provide for values for the compensation tables. The table includes for each side six parameter values (one per facet) that describe the requirements to achieve equal start of scan cross-scan positions. This corrects the beams of FIG. 8 at the start of scan, resulting in FIG. 9. Similarly, calibration produces for each optical scanning unit six parameter set values (one set per facet) that describe the requirements to achieve equal end of scan cross-scan positions. This leads to corrections shown in FIG. 10 starting from the results shown in FIG. 9. Clearly these corrections are applied in parallel rather than sequentially.

Beam Length Variations

Another correction that needs to be carried out is to correct for the different lengths of the scan lines as shown in FIG. 10. The length differences are caused, for example, by the inaccurate mechanical finishing of the angles of the surface planes of each polygon, by any variations in the polygon rotation speed, or by the center (the axis) of the polygon not being at its theoretical center. The correction for these variations is done by adapting the pixel clock. The pixel clock is a periodic signal that synchronizes the modulation of the laser on and off during imaging. The time period of the pixel clock is proportional to the size of the pixels along the scan line direction. Thus varying the pixel clock period varies the end of image point (e.g., point 83 of FIG. 13 for side 8). By shrinking or stretching the clock signal, this aspect of controller 75 can adapt the end position in the scan line direction. This is called scan line direction length correction. For a six facet polygon as used in the preferred embodiment, there are six different scan lines per side, so twelve parameters set the lengths if the scan lines of the different sides, leading to twelve different pixel clock signals. For each facet a new pixel clock with its own correction table is used. This is the same as two separate pixel clock generators generating the pixel clocks of the two optical scanning units, and changing the correction as each new facet is encountered.

To correct in the scan line direction, accurate timing of the start of scan is used. For this, the scan line direction detection capability of the SOS detection modules is used. Thus, when the scanning beam on one side, say side 8, starts the scanning of its assigned scan line 19, the light is incident on the detector module 56, thus causing a first control pulse to be generated as shown by signal 92 on start of scan (SOS) signal 86 in the set of timing diagrams in FIG. 13. In one implementation, as shown in FIG. 13, a second, end of scan (EOS) control pulse shown as pulse 93 on end of scan (EOS) signal 87 is generated when the scanning beam has reached the end of scan point as indicated by end of scan detection module 55. Clearly, for the sake of explanation, the relative dimensions of pulses and components in FIG. 13 are shown exaggerated.

One implementation of the detection of scan line direction positioning uses four-quadrant diodes. Referring to FIG. 14, the generated scan line direction positioning pulses (the first and second pulses) are such that the down-going edge of each pulse coincides with the moment at which the light beam reaches one of the quadrants a or c, and the up-going edge with the moment at which the spot crosses the separation between the quadrants a and b or c and d. The result of $(Ia+Ic)-(Ib+Id)$ is shown by curve 103 which is symmetrical with respect to point 0 which is at the interface of quadrants a and c and quadrants b and b. Point 0 may thus be used as a reference point in the scan line direction position. Timing pulse 106 may then be generated in which the down going edge indicates the point in time when the beam hits either quadrant a or c, and the rising edge indicates the point in time when the beam passes the reference point (the line separating a and c, and b and d). Alternate detector shapes also may be used. For example, another rectangular shape may be added behind the square formed by the two triangles previously mentioned with the surface area of the rectangle equal to the surface area of each triangle.

In order to obtain scan line direction length correction automatically, in one embodiment, the pixel clock oscillator of each polygon is phase-locked using the start of scan and end of scan signals generated from the SOS and EOS detection units. This enables an exact phase relation between the starting of scan point (denoted $t_1$ for side 8 on the timing diagrams of FIG. 13) and the position of the first scanned pixel, say at a time denoted $t_2$ on side 8.

The EOS control pulse 93 is used to tune the pixel clock frequency so that the distance crossed between the SOS and the EOS control pulse is divided into a constant number of M pixels per scan line. Since the pixel length is constant in distance, M pixels'distance defines a constant length line, and exactly M pixel pulses are generated between SOS pulse 92 (at time $t_1$) and end of scan control pulse 93 at time $t_5$. In such a manner, each optical scanning unit (17 or 18) scans an equal number of pixels per unit length. The value of M being obtained by $$M=(\text{Scan line length})/(\text{pixel size}).$$

Generating end of scan control pulse 93 is useful because elements in optical scanning units 17 and 18 do not generate identical lines, for example because the different facets may each have different lengths. By generating a SOS control pulse 92 and EOS control pulse 93 for each side, the time period for each scan line on either side can be exactly determined by determination of the time difference between the SOS and the EOS control pulses. The generation of SOS control pulse 92 further enables checking cross synchronization of the scans on the two sides. Because of imperfections, the physical locations of the first pixel on the PCB panel would typically not be spaced exactly one sixth of a revolution of the polygon apart. Using an SOS signal enables having the start of each pixel be located on the same line 77.

Figure 16:
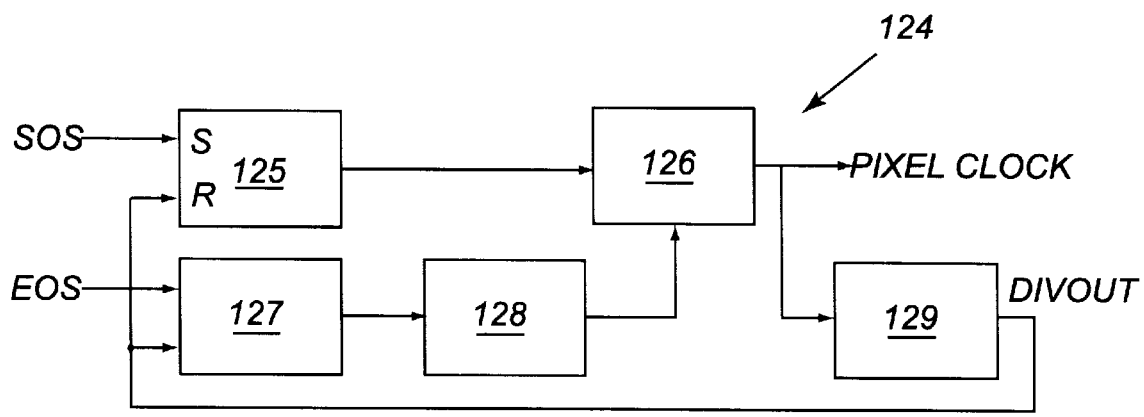
FIG. 16 shows a block diagram of an embodiment of a control circuit used for generating M phase synchronized pixel clock pulses.

FIG. 16 shows one embodiment of another control circuit 124 also implemented in controller 75 and provided for generating the M pixel clock pulses for each of the polygons for one polygon face after another. In one implementation, two such circuits are used, one for each of sides 8 and 9. In the preferred embodiment, because the imaging is multiplexed so that only one side is imaged at any instant of time, the same pixel clock control circuit 124 can be used for both sides. Control circuit 124 is a phase locked loop circuit. The first control pulse (SOS pulse 92) indicating the start of scan point is supplied at a set input of a flip-flop 125. An output of flip-flop 125 is connected with an input of a voltage controlled oscillator 126 (VCO) which supplies, at its output, the M pixel clock pulses of the pixel clock signal. The second control pulse (EOS pulse 93) indicates the end of the scan line and is supplied at an input of a phase detector 127, an output of which is connected to a low pass filter 128 (LPF). The output of LPF 128 is connected with a control input of VCO 126. The clock signal output by the VCO is also supplied to a modulo M counter 129 whose output is connected with a reset input of flip-flop 125 and to phase detector 127.

The receipt of the SOS control pulse causes flip-flop 125 to output a signal thus enabling the VCO output to supply the clock pulse signal. The raising edge of the $M^{th}$ pixel clock pulse causes modulo M counter 129 to output a signal DIVOUT. The raising edge of the DIVOUT signal resets flip-flop 125 which in turn will stop VCO 126 outputting pulses. Phase detector 127 receives the end of scan control pulse supplied by an end of scan detection module (56 on side 8) as well as the signal DIVOUT. The phase detector measures the time difference between the raising edge of the EOS pulse and the raising edge of the signal DIVOUT. The purpose of the control circuit 124 is to maintain this time difference equal to zero, this signifying that the pixel clock oscillates at the correct frequency and is in phase with the scanning beam. Indeed, under this control, the scanning beam reaches the end point of the scan line at the same time as the $M^{th}$ pixel clock pulse. The raising edge of the signal DIVOUT preceding or coming later than the raising edge of EOS control signal indicates that the pixel clock is not in phase with the scanning beam.

The control circuit of FIG. 16 enables controlling the individual optical scanning units 17 and 18 and ensures that the pixel clock is synchronized with the scanning beam sweep. Thus the beams are equalized so that the scan line pattern on each side resembles that shown in FIG. 11.

The path of the light spot of beam 15 on side 8 and the various timing signals are now summarized, again with the aid of the timing diagram on FIG. 13 which shows several timing signals plotted as a function of time denoted t. The laser of side 8 is first turned on at some time to (to is synchronized with the scanning of the other side, side 9) which is known to be before the beam hits start of scan detection unit 56. SOS pulse 92 (in particular the raising edge) on SOS signal 86 signals the start of scan at a time denoted $t_1$. The laser may now be turned off as shown on laser signal 85. The beam steering control circuit of FIG. 15 has by now been turned on as shown by beam steering switching signal 88. Timing is determined by using a timing circuit that generates pulses at a finer resolution than the pixel clock. A counting circuit now counts a number of pulses of a timing circuit corresponding to the known physical distance between the start of scan point (where the detection modules are located) and the start of image point 81. This time is shown as segment 94 of non exposing signal 90. The detectors may now be turned off as shown on detector time signal 89. At the end of non-exposing start segment 94 of signal 90, at a point in time denoted by $t_2$, the start of image is reached as indicated by image exposure zone signal 91. Note that at this time, the laser is turned on and off under control of the pixel clock and modulated according to the imaging data. This continues until end of image point 83 is reached at a time denoted $t_3$. This is determined by a counter counting the number of pixels in the scan length. The laser is now turned off and the non-exposing end zone signal is turned on as indicated by signals 91 and 90, respectively. Some time after the non-exposing end zone period starts, say at time $t_4$, the detector is turned on and the laser also is turned on enabling the end of scan detector to operate. The end of scan pulse 93 on EOS signal 87 indicates the end of scan, say at time $t_5$. The beam steering controller is now turned off, as are the detectors, this indicated by signals 88 and 89, respectively.

In an alternate implementation to using the control system of FIG. 16, compensation tables are built up based on calibration runs that determine the overall length of each individual scan line for each facet (by using some fixed clock). This provides for six values of the length of the scan lines for each optical scanning unit polygon for the six-sided polygons used in the preferred embodiment, and each value may be the total scan lines, or just the 24 inch longest image line. In addition, the scan line direction non-linearities of each beam may be measured in a calibration phase, for example, by placing a detector at regular distances (e.g., every 1 inch) on the focal plane and measuring the numbers of pulses of a particular clock required for the beam to move from one detector position to the next. Doing this for each beam and for each facet produces 12 tables for the case of two sided scanning with one beam per side and a six facet polygon per optical scanning unit. Having more beams per side and/or more facets per polygon would require more tables as would be clear to those of ordinary skill in the art. These tables can then be used to adjust the pixel clocks of the beams in an open loop manner.

Synchronizations Between the Two Optical Scanning Units

The above describes how to achieve near perfect beams on each side independent of the other side. For cross-positioning, when the method described herein is applied in the preferred embodiment which can scan a panel of up to 24 inches in height (the scan line direction) and up to 36 inches in length (in the D-direction), an absolute positional accuracy on the panel of less than 0.5 mil (12.7 $\mu$m) is achieved in the transverse (D) direction between the two scan lines. In the preferred embodiment, one scans at 2000 and 4000 lines per inch (lpi). Higher resolutions also may be possible depending on the inherent detector resolution and the electronics.

Beside the control of each individual optical scanning unit, it is also necessary to have the two optical scanning units 17 and 18 synchronized with respect to each other. Synchronization of the optical scan units is achieved by generating a master trigger reference, and phase locking each of the drivers of the two polygon motors, with the appropriate phase difference (30 degrees for six-facet polygons) to the master reference trigger. The phase locking uses some feedback mechanism, for example, an encoder, and forms a motor control circuit that is part of controller 75 that maintains the correct speed and the required phase difference between the rotation of the two polygons. This synchronization could also be accomplished by mechanically coupling the polygon rotation axes with a timing belt.

Figure 17:
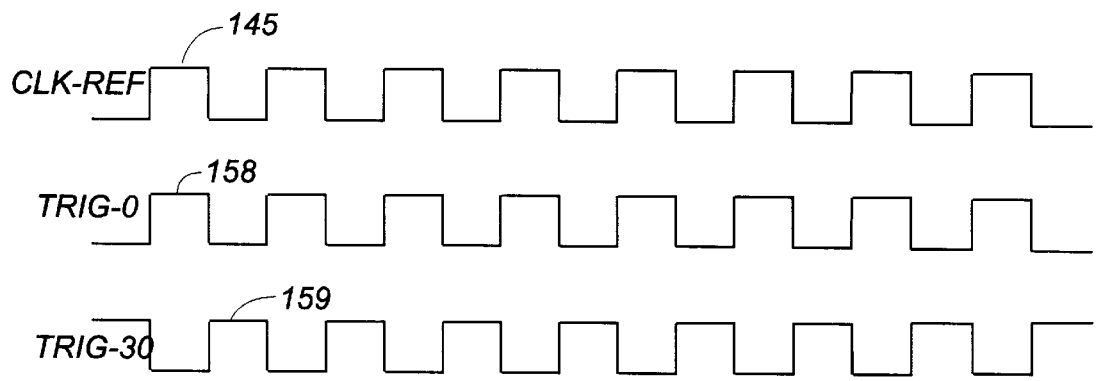
FIG. 17 shows a set of timing pulses used in controlling the motors in a synchronous manner.
Figure 18:
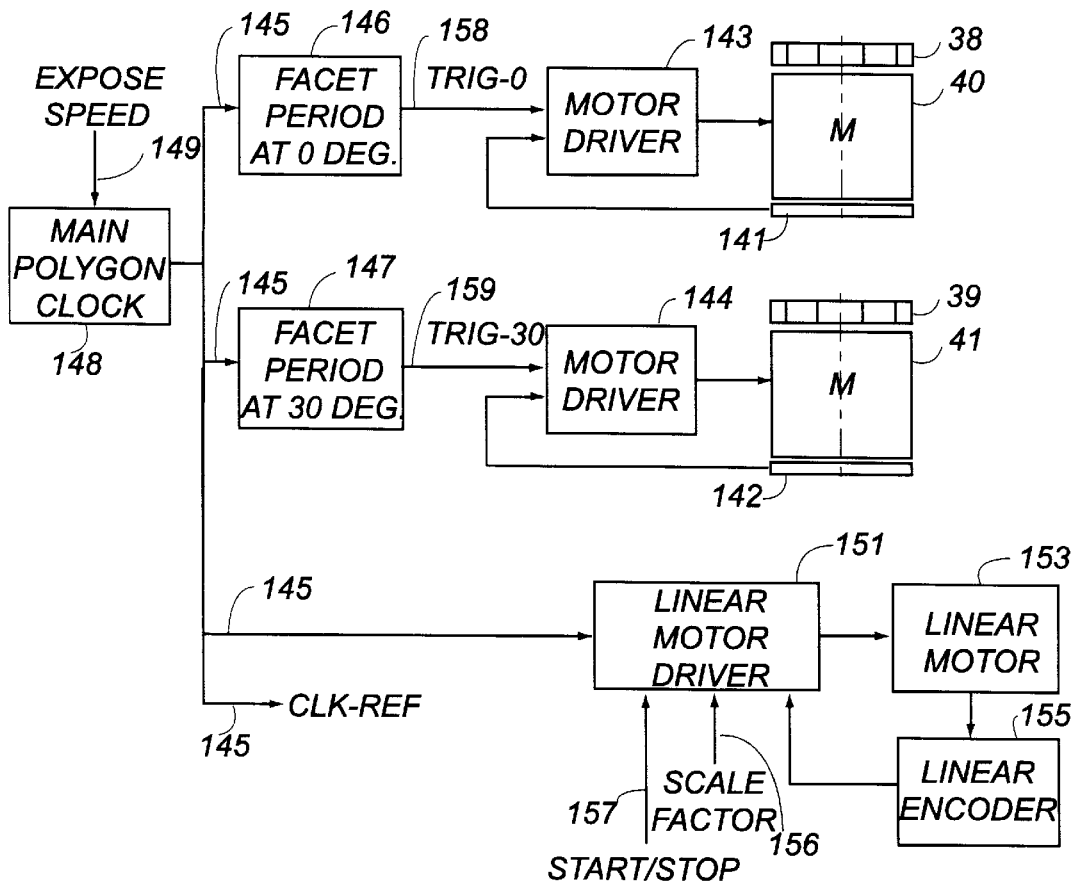
FIG. 18 shows a circuit for controlling the two motors driving the two polygon heads and the linear motor.

The control circuit for driving the two motors is now described with the help of FIGS. 17 and 18. FIG. 18 shows an embodiment of a circuit for synchronizing the motors 40 and 41 of the individual optical scanning units 17 and 18 with each other. Each polygon 38 and 39 is driven into rotation by its respective motor (40 and 41 respectively). Each motor also is provided with a pulse encoder (141 and 142 for motor 40 and 41, respectively). Pulse encoders 141 and 142 each generate a signal, and each such signal is fed to one terminal of a phase detector in a corresponding motor driver (143 and 144 for motor 40/encoder 141 and for motor 41/encoder 142, respectively), the output of which drives the corresponding motor. The other terminal of phase detector of each motor driver (143 and 144, respectively) is fed by a control pulse signal (TRIG-0 and TRIG-30, respectively, with reference numerals 158 and 159, respectively) which is generated from the master trigger reference CLK-REF (reference numeral 145). CLK-REF is generated by a main polygon clock circuit 148. The relationship of the master signal CLK-REF to the two motor trigger signals TRIG-0 and TRIG-30 is shown in FIG. 17. Each of these signals has one rising edge for each facet of the polygon, and thus 6 pulses per revolution of the motor. TRIG-0 and TRIG-30 are offset by $\pi$ from each other, which is 30 degrees of a complete revolution of 360 degrees.

Clearly other means of providing synchronizations between the two motors are possible, as would be clear to those of ordinary skill in the art.

Master clock CLK-REF also is used to synchronize the linear motor driving PCB panel 4 in the D-direction, as is shown in FIG. 18. Linear motor 153 has a linear encoder generating pulses that are fed back to one terminal of a phase detector on linear motor driver 151. A scale factor parameter 156 and a start/stop parameter 157 also are fed to the linear motor controller.

Other timings in the system also are driven or locked by signal CLK-REF.

Determining the switching point of the beams from one optical unit to the other is now described. In the preferred embodiment, a six-faceted polygon is used for optical heads 38 and 39, so that each complete rotation of polygons 38 and 39, respectively, produces six scan lines on sides 8 and 9, respectively.

In the preferred embodiment, the beams on side 8 and side 9 are not both on at exactly same time but alternately on (and modulated) and off for one scan line. The duty-cycle of each of polygons 38 and 39 is less than 50%, and laser light 32 from single laser 31 is switched from one side to the other using an optical switch deflector 33 after the beam on one side reaches the end of scan. When that occurs may be detected by having the motors be synchronized as in the above described synchronization method. During the off duty cycle of one side, the facets of the polygons 38 and 39 are mutually adjusted so that the other side will be in the on cycle. The position of picking up the light by detection modules 55 through 58 preferably is as close as possible to the edge of the 24-inch scanning line positions. In the preferred embodiment using the 6-facet polygon, imaging a 24 inch scan line involved rotation of the polygon of 28 degrees, so that the duty-cycle of for imaging a 24 inch scan line is 28/60=46.7%, and detection of the start-of-beam and end-of-beam signal is then carried in at most 3.3% of the exposure time. Because the laser needs to be switched from one side to the other during this same time, less than 3.3% of the time is available. Thus, allowing for detecting the laser light in an area of 0.5 inch on either side of the 24 inches results in the polygon rotating through 29.2 degrees. This still leaves 1.3% of the exposure time to switch the beam from one side to the other.

The position in the scan line direction of the start of image point (point 81 on side 8) is an offset or delay that controller 75 gives after the start signal detection time ($t_1$ on side 8) and before the start of image time ($t_2$ on side 8). Two parameters define this—one parameter for each side. For example, for side 8, the delay parameter is time ($t_2-t_1$). As already mentioned above, the switching time is preferably set using the motor synchronizations.

Cross-Scan positioning between the two optical scanning units

In the case of two 6-facet polygons 38 and 39, there are 12 different scan lines written per revolution, six on each side. This is for a system that has a single beam per side. During exposure, PCB panel 4 moves continuously at a constant speed in direction D. It is desired to have the scan line coincide exactly in the transverse direction on each side. Because motion in the D-direction, the scan lines from one side to the other are "interlaced" with those of the other side. When stationary, the two optical scanning systems are adjusted to generate scan lines that are co-incident on each side. During the scanning of one scan line in the scan line direction, suppose the panel moves a distance $\Delta D$ in the D-direction. With no further adjustments, scan line 19 of side 8 would shifted over on side 9 the distance in the $\Delta D$-direction traveled during one scan line. The preferred embodiment includes a mutual positioning mechanism to bias the cross-scan position of the scan lines, the biasing dependent on the transverse direction speed, the biasing ensuring that the scan lines overlap on each side during scanning. Without the biasing, when one scan line is complete on one side, the scan line on the next side would be displaced in the D-direction.

Thus, the mutual positioning mechanism is directly coupled to the optical system exposing apparatus 12 and to the frame of the system. The optical scanning units are directly coupled to the mutual positioning mechanism.

For mutual positioning (i.e., cross-positioning) in the cross-scan (D) direction, optical means preferably are used. For this, optical detection units are used. In particular, one or more of the optical detection units 55, 56, 57, and 58 that also are used for accurately positioning each beam on its own side are used for the mutual positioning. The same detection module is preferably used for detecting scan lines on opposite sides of panel 4. In that way, one can reference the scan lines of opposite sides to each other. In this, a consideration to take into account is that a PCB panel to be exposed can have different thicknesses, varying for example from the thinnest single inner PCB panel, to the thickest multi-layer board after lamination of the inner panels and the outer foils. Typically, both the optical units may be shifted in a range of 3 mm-in the E direction (the panel thickness direction), yet one needs to have both beams 15 and 16 hit any of the detection modules 55, 56, 57 and 58 that are used for mutual positioning in a manner to produce accurate readings independent of the panel thickness. Each of optical scanning units 17 and 18 produces beams that are not 100% telecentric at the end of the 24 inch scan length, that is, the beams do not hit the side of PCB panel 4 perfectly perpendicularly at end of the 24 inch scan length. The angle varies from zero degrees in the middle of the 24 inch scan line to 4 degrees at both ends. Thus, if the detectors are aligned to detect the beam in focus at one board thickness, they may not do so in focus for another board thickness. In the preferred embodiment, the detection modules used are configured to accurately measure variation in the cross-scan direction substantially independent of the spot size of the beam. This is achieved by the detection module aspect of the invention using detection modules configurations described hereinabove that measure cross-scan direction variations using differential signals. Note that the invariance to beam spot size is only needed in the cross-scan direction of the opposite detection module in the preferred embodiment.

While the description herein for cross-scan direction mutual positioning is for a single beam optical scanning unit on each side, any of the beams of a multi-beam optical scanning unit may similarly be used for mutual positioning. For the alternate embodiments that use other exposing methods than generating beams that form scan lines, a collimated laser beam may be included with one or both optical exposing units to provide the necessary beam for mutual positioning.

Figure 7:
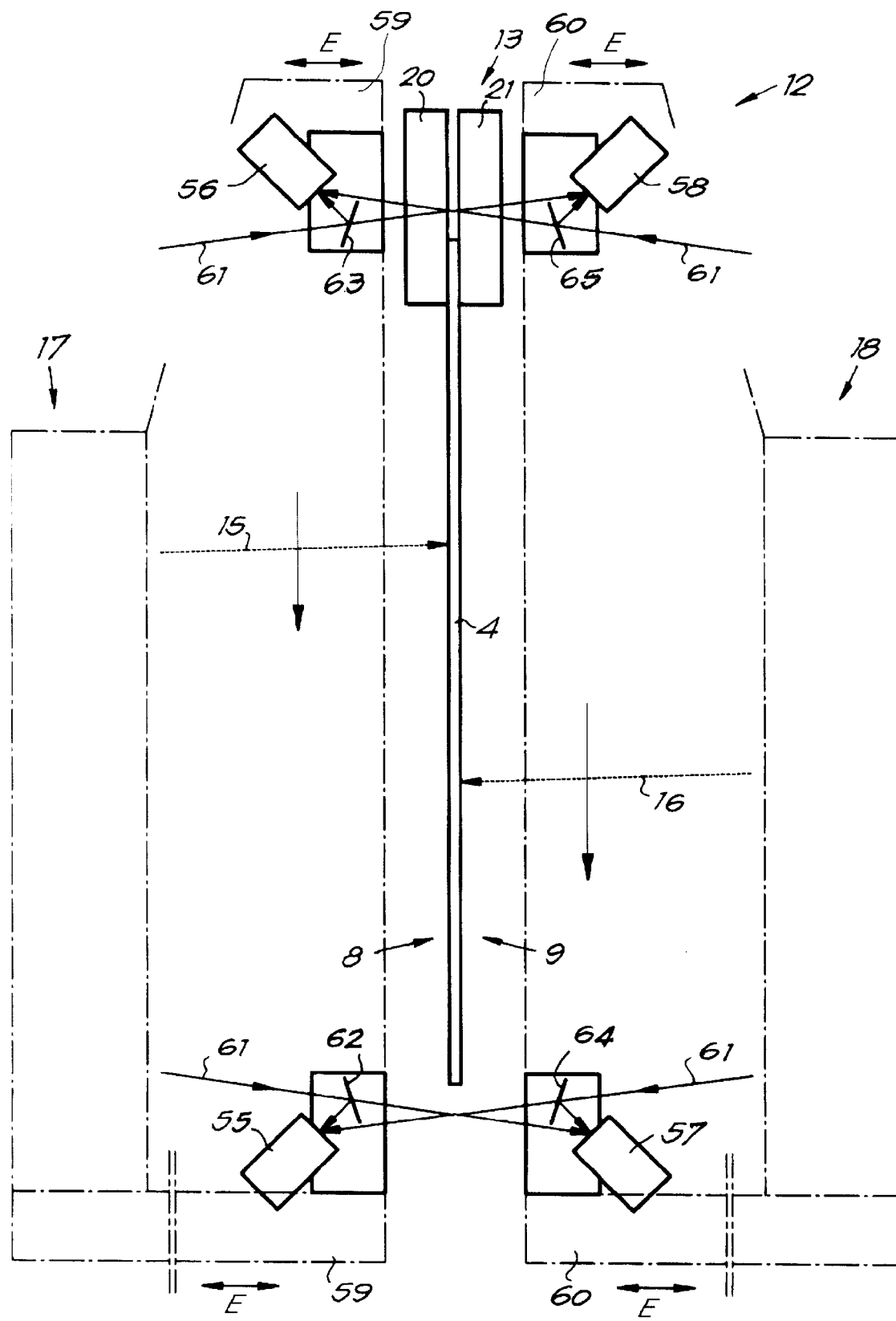
FIG. 7 shows, in a cross-sectional view, an adjusting mechanism which can be applied in the exposing apparatus such as the device of FIG. 4.

To continue with the description for the preferred embodiment, the scan lines on one side need to be offset an exact distance from the scan lines on the other side. Detection modules 55, 56, 57, and 58 may be used not only for adjusting the image created by their optical scanning units 17 and 18 imaging independently onto sides 8 and 9, respectively, but, in one embodiment, detection module 55 and 56 are also used to carry out particular adjustments of the image created onto the opposite side 9 by optical scanning unit 18. Similarly, detection module 57 and 58 also can detect beam 15 from optical scanning unit 18. To this end, in the preferred embodiment, each of detection modules 55 through 58 are directed with their detection surfaces aimed towards PCB panel 4. Mirrors 62 to 65 for modules 55 to 58, respectively, are semi-transparent mirrors located in between the plane of PCB panel 4 and each of detection modules 55 through 58, respectively. Thus, as shown in FIG. 7, in the case of modules 55 and 56 on sides 8 and 9, respectively, of PCB panel 4, a single beam 61 both passes through semi-transparent mirror 62 to detector module 57, and is reflected to detector module 55.

Note that in the preferred embodiment, during scanning of a PCB panel, carrier 13 is between the detectors on top in the preferred embodiment. For this reason, in this embodiment, the top detectors (56 and 58) do not detect the beams from both sides during scanning. The top detectors cross-side detection capabilities are used only to check and calibrate the system while not scanning. The positional (side to side) feedback is still used with the bottom detection modules during scanning as described in more detail below.

The alignment is now described. First, the two scan lines from each optical scanning unit, after all the "same-side" corrections, are aligned with respect to each other without a PCB panel and without carrier 13 in place for a panel of 3 mm thickness (defined herein as the relative "zero position" or zero thickness). The 3mm thickness is selected as being half the maximum panel thickness likely to be encountered, assumed 6 mm herein, and a thickness other than 3 mm may also be selected as the relative zero thickness. This first alignment preferably uses the bottom two (end of scan) detection modules on each side and the two top (start of scan) detectors on each side. This fixes the relative positioning of the two optical scanning units in the D-direction, and hence the two optical heads (the polygons) in the D-direction, since these heads are mechanically attached to the detection modules on each side. Thus, by checking the optical signals one mechanically positions both optical heads to the "ideal" position relative to each other in the D-direction. The two scan lines 15 and 16 are adjusted to lie one on top of each other.

Adjustment signals are now determined for each side to apply to the corresponding beam steering unit (43 or 44) to move (bias) the scan lines by a distance so that with the motion in the D-direction, the scan lines still coincide from side to side. Denoting the distance that is moved in the cross-scan (D) direction during the scanning of one scan line in the scan line direction by $\Delta D$, the signal required for beam steering unit 43 to move beam 15 by $+AD/2$, and the signal required for beam steering unit 44 to move beam 16 by $-\Delta D/2$ are determined. When these two signals are used to bias beam steering units 33 and 34, respectively, during scanning with motion in the D-direction, the correct distance in the cross-scan direction between the scan lines 15 and 16 is maintained. In the preferred embodiment, the relationship between the offset from the zero position of the laser light in the cross-scan direction and the offset in the cross-scan part of any detection module is known, so the detectors may be kept at the required offset to achieve the desired beam shift bias in the D-direction. The advantage of the particular detectors used herein is that the differential output varies directly with the cross-scan position, and such a differential signal is relatively insensitive to the beam width, and thus the focus.

During exposure both polygons are controlled independently but synchronized with respect to each other as described above (see FIG. 18). The two polygons are referred to each other using the cross-scan direction measurements of bottom (EOS) detection modules 55 and 57, respectively, which can detect when the two beams 15 and 16 at each side 8 and 9, respectively, are correctly aligned. The required biases are applied to beam steering units 43 and 44, respectively, in addition to the corrections to the beam required to keep each beam accurate on each side. Note that the distance AD of the shift will be different depending on the resolution and number of beams used.

In alternate embodiments, different clamping devices can be used that do not get in the way of each top detection module's being able to detect a beam from either side. For example, the clamping device may have a cutout to allow the beams on each side to reach the upper detection modules.

Another advantage of the design aspect of the preferred embodiment of using a single detection module for detecting beams on both sides of the sheet being scanned is that it is amenable to using multiple beam systems whereby each side is scanned by a plurality of beams. As described above, any of the beams in a multiple beam system can be used for the mutual positioning. Thus that one beam is turned on at or close to the time it is expected to pass through any of the detectors. This beam is then turned off again, and at the time of start of image, all the beams are turned on according to the imaging data.

The machine software running the relevant components of controller 75 causes a beam to be on during the period when that beam hits one or more detectors but does not hit the PCB panel. FIG. 13 includes five time signals 85 through 89, respectively, each shown starting from 0% of the duty cycle to 50% of the duty cycle. Curve 65 shows the laser on laser off signal which shows the turning on of the laser during the time that the beam reaches both the start of scan detection module and the end of scan detection module.

Clearly, different alternatives are possible for the mutual positioning. Depending on the required corrections, more or fewer detection modules may be used by which such crosswise detection is carried out. Furthermore, the crosswise detection does not necessarily have to be carried out by the same detection modules having the above-described dual function. That is, separate detection modules may be used. For example, the detection module 55 may be replaced by two detection modules, both located at side 8, in which one detection module is used to adjust the scanning position of light beam 15, whereas the other detection module is used to adjust the scanning position of light beam 16. One also can use a second light source to keep or to measure the position of the scan lines relative to each other, in order, for example, to overcome low sensitivity of the detectors in the UV range, in the case that the detectors have such low sensitivity to UV.

Note that with this configuration, the detectors are always in focus for the beams in their respective sides, but may not be in focus when detection beams form the opposite side. The detector design disclosed herein provides for cross-scan position detection which is relatively insensitive to the focus of the beams, and therefore, the method and device described herein accurately performs the mutual positioning independent of the thickness of the PCB board.

Note that alternate embodiments might have the scan direction be horizontal. That is, path 19 is horizontal, and direction D is vertical. The above adjustments also can be carried out in such alternate embodiments, in which case the detection modules are not mounted in a vertical, but in a horizontal plane.

Nevertheless, the above adjustments can also be carried out in other embodiments in which the sheet (PCB panel 4 or some other sheet having one or more sensitive layers) is kept in a position other than vertical, e.g., horizontal on a table. In the horizontal positioning case, both path 19 and direction D perpendicular to path 19 are horizontal.

Figure 20:
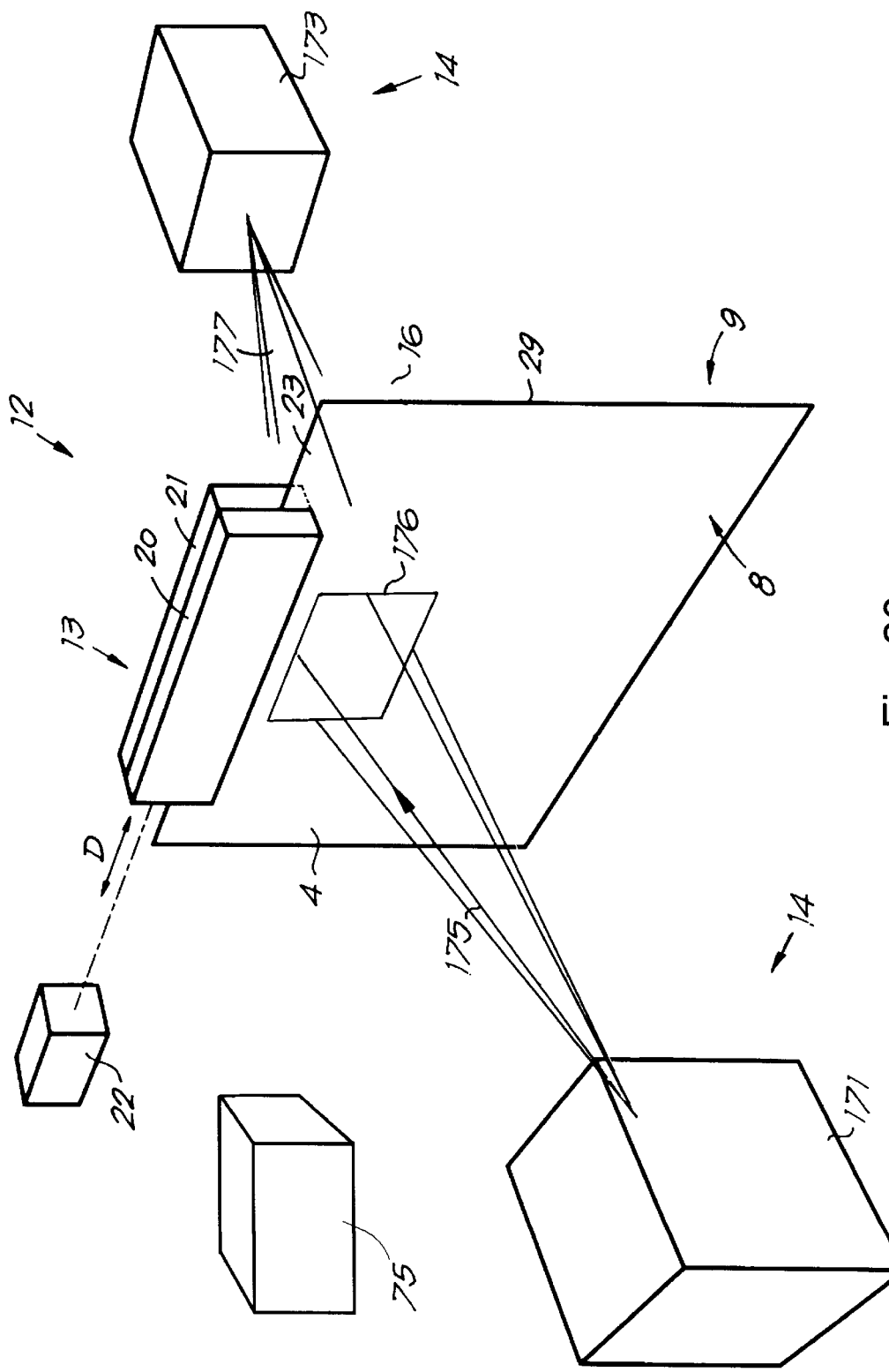
FIG. 20 shows a further embodiment of the invention wherein the optical exposing units image part of the complete image onto each side.

FIG. 20 shows yet another embodiment for realizing the invention. This is a modification of the system shown in FIG. 4. In this case, optical system 14 comprises two optical imaging units 171 and 173 located on opposite sides of PCB panel 4. That is, optical scanning units 17 and 18 of FIG. 4 are replaced by optical imaging units 171 and 173, respectively, which, rather than form scan lines as do optical scanning units 17 and 18 of FIG. 4, project sub-images ("tiles") onto sides 8 and 9, respectively, one such sub-image shown as 176 projected by light rays 175 generated by optical imaging unit 171. When sub-images are projected by each of optical imaging units 171 and 173, a common step-and-re-image process may be used to complete the whole image of each of sides 8 and 9 by projecting new sub-images using corresponding imaging data. Each sub-image such as image 176 is formed from the part of the imaging data corresponding to that part of the image to be formed on the particular side. Part of the step and re-image process is in direction D, which the other part is in a direction transverse to direction D. Each of optical imaging units 171 and 173 preferably comprises an LCD light shutter to form a mask according to part of the imaging data. Each of units 171 and 173 also includes a source of light energy and optics to project the sub-image onto the side of PCB panel 4. Mechanisms other than LCD panels may also be used, as would be clear to those of ordinary skill in the art. For example, in another embodiment, a two dimensional multi-element acousto-optical modulator or two-dimensional deformable mirror based optical imaging unit is used. See for example, U.S. Pat. No. 5,208,818 to Gelbart, et. al. (May 4, 1993) incorporated herein by reference.

While not essential for the invention, in the preferred embodiment of the system shown in FIG. 20, the imaging of both sides occurs simultaneously. The timing synchronization of the two optical imaging units occurs electronically under control of controller 75. The step and re-image motion in the direction transverse to direction D is preferably provided by moving the two optical imaging units up and down while D-direction motion is provided as in the embodiment of FIG. 4. Clearly, PCB panel 4 may alternatively be moved up and down to provide motion transverse to direction D. The mutual positioning of the images produced on the two sides is carried out by modifying the method described above. That is, one first adjusts the two optical imaging units relative to each other while there is no PCB panel in carrier 13. Since the two optical imaging units are now accurately positioned with respect to each other, the exposing produces images on the two sides that are accurately positioned with respect to each other. For this purpose, optical imaging units 171 and 173 are each provided with a laser that produces a finely collimated beam that is used by optical detection modules for positioning. Such laser sources are fairly inexpensive to add. Thus, how to modify the mutual positioning methods any of the optical scanning unit embodiments described herein to use the imaging units of optical imaging units 171 and 173 would be clear to one of ordinary skill in the art.

It should now be clear to one of ordinary skill in the art that the two-sided imaging with accurate mutual positioning aspects of the present invention can be implemented not only by the optical scanning units of the preferred embodiment described above, but also by many alternate techniques for exposing sensitive layers on flat panels, for example for imaging a pattern on the sensitive layers according to imaging data. FIGS. 23A–D show several such other possibilities. In each of these, only one side is shown. It is understood that in each case, an identical system for imaging the opposite side of PCB panel 4 also is provided, together with a mechanism for accurately mutually positioning the image on one side relative to the image on the other side.

Figure 23A:
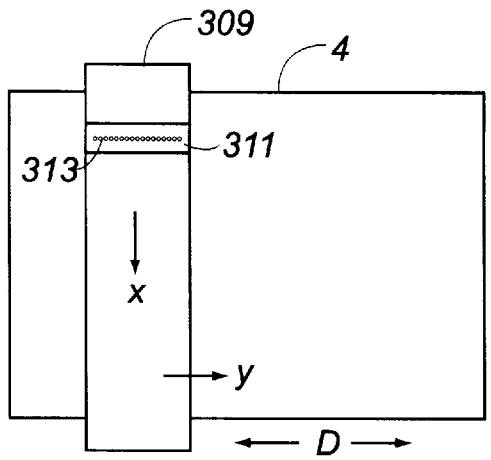
FIGS. 23A–23D show different implementations of optical exposing units according to further embodiments of the invention.

FIG. 23A shows an example of a multi-beam imager that includes a light imaging head 311 that includes a mechanism 313 to image a set of scan lines in the scan line direction shown as direction x, the imaging according to imaging data. The light imaging head moves back and forth exposing several scan lines per swathe. The light imaging head is mounted on a carriage 309 which is stepped between swathes in the D-direction shown as direction y. Several methods are available for generating the swathe of modulated scan lines. The light imaging head images only in one direction, say the downward x-direction. Several technologies are available for light head 311, including laser diode array in which the laser diodes are individually modulated, and a single light source illuminating a multi-element modulator, the output of which is then optically transformed to a set of spots which, with the motion in the scan line (x) direction, generates the set of scan lines.

Figure 23B:
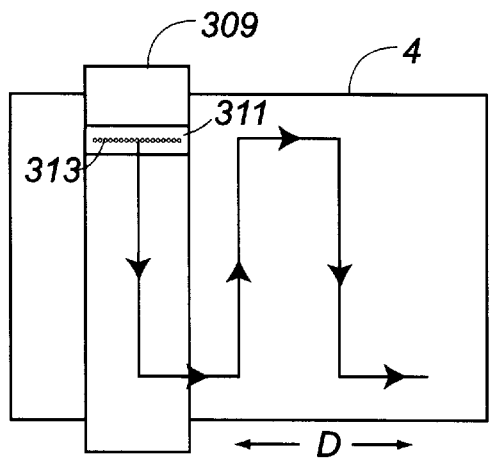

FIG. 23B shows another variation similar to that described in U.S. Pat. No. 4,962,464 to Henzi, et. al. (Oct. 9, 1990) entitled "SERPENTINE COLUMNAR PLOTTING SYSTEM" incorporated herein by reference, modified as required for the particular application, e.g., exposing PCB panels. As in the variation of FIG. 23A, light imaging head 311 again includes imagers 313 to image a set of scan lines in the scan line direction according to imaging data. Again, several technologies are available for generating the modulated scan lines. Optic head 311 in this case moves in a "serpentine" way with respect to PCB panel 4, with the light imaging head imaging when moving both up (−x-direction) and down (+x-direction) in the scan line direction.

Figure 23C:
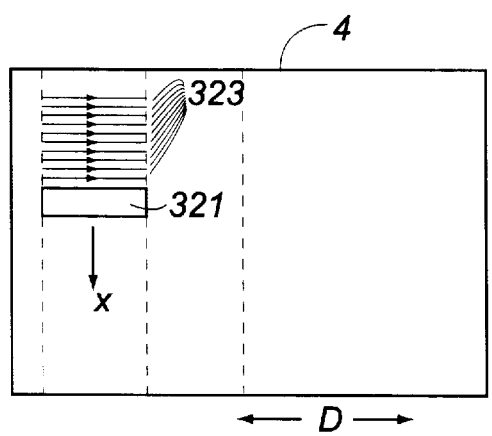

Yet another variation is shown in FIG. 23C, this one modified from U.S. Pat. No. 5,580,698 to Andersen (Dec. 3, 1996) entitled "SCANNER SYSTEM FOR SUCCESSIVE IRRADIATION OF A WORKING SURFACE, PARTICULARLY FOR ULTRA-VIOLET EXPOSURE OF A PHOTO EMULSION ON A SERIGRAPHIC PRINTING FRAME," incorporated herein by reference. In this case, optical imager 321 forms one or more scan lines in the D-direction, a set of previously exposed scan lines shown as 323 in FIG. 23C. optical imager typically is a laser scanner. Optical imager 321 is moved in the x-direction to form a strip of scan lines. The side of PCB panel 4 is then imaged strip by strip.

Figure 23D:
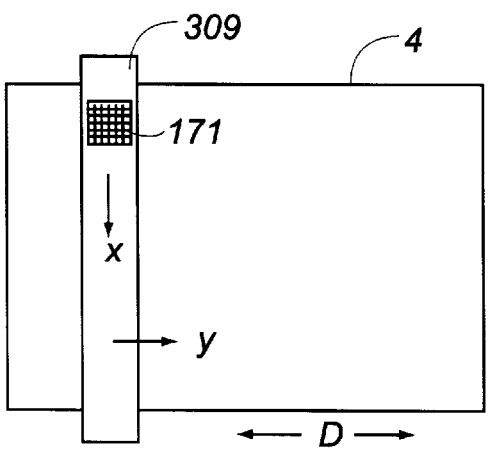

Yet another variation is shown in FIG. 23D, this one a particular implementation of the system shown in FIG. 20 that images "tiles" or "stamps" of sub-images. Carriage 309 is provided with a two-dimensional imaging unit such as units 171 (or 173) of FIG. 20, and thus is labeled 171 in this figure. The imaging unit, for example, may use an LCD, or a two-dimensional acousto-optic modulator. See U.S. Pat. No. 5,208,818 to Gelbart et al. (May 4, 1993) entitled "LINEAR SYSTEM FOR RECORDING DATA PATTERNS ON A PLANAR SUBSTRATE," incorporated herein by reference for one implementation easily adapted for the present application. Imaging unit 171 images one stamp. The imaging unit is stepped one tile in the x-direction, and the next tile is imaged according to the corresponding part of the imaging data (the sub-image). Once the full column is completed in the x-direction, carriage 309 with the imaging unit is moved one tile in the y-direction. The exposure of the next column then starts, each tile being imaged according to the corresponding part of the imaging data. Note that while square tiles are shown, in general, the tiled need not be square-rectangular tiles or even hexagonal tiles may be used, and the tiles may be overlapped for easing the abutment.

When used for two-sided exposure, in one aspect of the invention, a mechanism to accurately mutually position the exposing units on each side in the D-direction is provided. Using a laser beam from one side detected by a detector coupled to the other side is one method described hereinabove using a detection module which measures variation in the cross-scan direction (D-direction in FIGS. 23A–D) substantially insensitive to the focus. For example, as already described above in reference to FIG. 20, a collimated laser beam may be provided on each side to achieve this when the optical exposing system on either side does not inherently generate a beam useful for such purposes.

Figure 24:
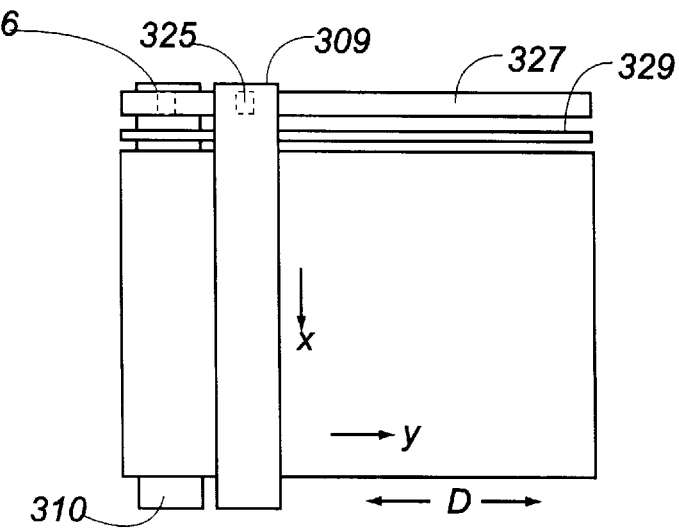
FIG. 24 shows alternate implementations of the cross-positioning mechanism for accurately positioning the image on one side of the sheet relative to the image on the other side of the PCB panel.

One embodiment of an alternate means for cross positioning in the D-direction for the case of a carriage (e.g., carriage 309) being provided on each side for mounting the optical imaging head is shown in FIG. 24. This shows side 8 of PCB panel, while side 9 is the back side not visible. Carriage 309 is for the exposing unit for side 8, while carriage 310 is for the optical exposing unit of back side 9 of PCB panel 4. The means for cross positioning includes a single measuring rule 327 in the D-direction, both sides' carriages 309 and 310, respectively, using the same D-direction rule using detection elements 325 and 326, respectively. Using the same rule ensures accurate mutual positioning in the D-direction. For determining start and/or stop positions in the x-direction, a transparent (e.g., glass) scale 329 with a straight highly reflective reference line is used. Both transports 309 and 3 10 are provided with means for accurately detecting the traverse of each optical exposing head on this reference line. In one embodiment, this detecting means is an optical reflective sensor that detects the very reflective reference line. The pulses from the respective sensor serve as the reference point for both front (side 8) and back (side 9) movements in the + and the −x direction. Note that the length of the scan lines along the separate x movements is guaranteed by using matched measuring rules on both front (side 8) and back (side 9) carriages.

Figure 12:
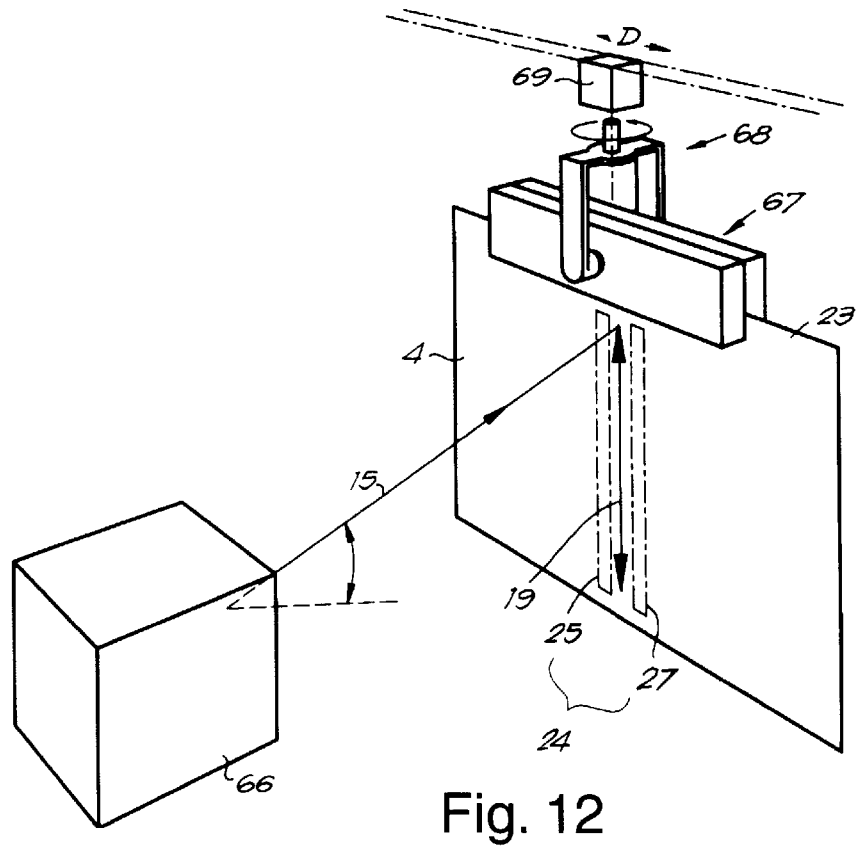
FIG. 12 shows another embodiment of the invention.

FIG. 12 shows another alternative embodiment for an exposing apparatus for scanning a light-sensitive sheet having light-sensitive layers 10 and 11 at both sides 8 and 9, the sheet being, for example, a PCB panel 4 for a PCB. In this embodiment, the scanning is carried out by means of a single optical scanning unit 66, located at one side. One side of sheet 4 is presented to optical scanning unit 66 for scanning with beam 15. Then the other side of sheet 4 is presented to optical scanning unit 66. The sheet is fixed in a carrier 67 from the beginning of the scanning of the first side until the end of the scanning of the second side 9. Carrier 67 is coupled to a drive system 68 that allows presenting sheet or PCB 4 with either side towards optical scanning unit 66. In the particular implementation shown, the carrier 67 consists of a clamping system, whereas the drive system 68 comprises a drive 69 which provides both a movement in direction D, and a rotational movement over 180° to change which side of sheet 4 is presented for scanning by optical scanning unit 66. The parallelogram correction described hereinabove (see the "Rotation of the scan lines" section) is included to ensure that the images on each side have vertical scan lines. Because sheet 4 (e.g., a PCB panel) is kept fixed in carrier 67 throughout the scanning of both sides, and in between such scanning, the sheet remains correctly positioned with respect to the carrier 67. The parallelogram correction is switched during the flipping of the board to ensure that the scan lines on either side are mutually positioned. It would be clear that using such an arrangement requires tighter control of the environmental conditions to achieve the same accuracy.

Figure 19:
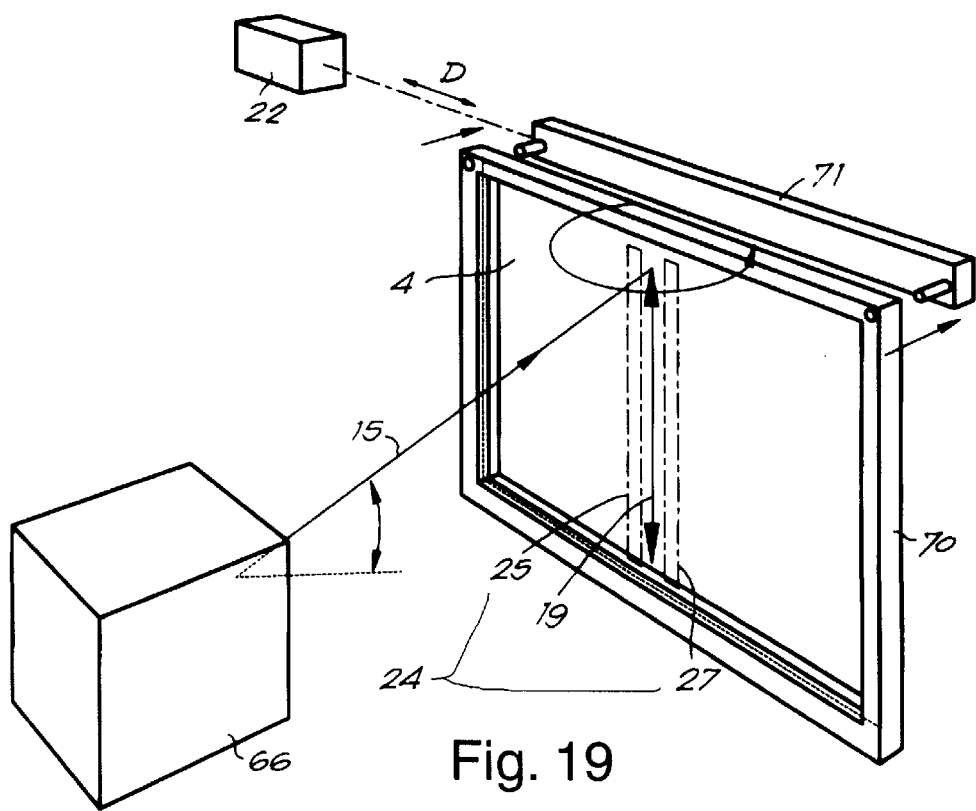
FIG. 19 shows a further embodiment of the invention.

FIG. 19 shows yet another alternative embodiment of an exposing apparatus for scanning a sheet 4 such as a PCB panel, in which sheet 4 is kept in a carrier that comprises a movable holder 70 which cooperates with a support device 71 so that that holder 70 can be positioned in two positions in support device 71, the first position having one side of PCB panel 4 towards an optical scanning unit 66, and the second position having the other side of PCB panel 4 towards optical scanning unit 66. Parallelogram correction as described hereinabove (see the "Rotation of the scan lines" section) is included. When flipping over from scanning one side to the next, the parallelogram correction described hereinabove is switched to account for the reversal of the transverse direction relative to the PCB panel.

The functioning of apparatus of FIG. 19, and the method of exposing therewith, include the steps of fixing PCB panel 4 in movable holder 70, wherein the holder acts as a carrier; installing holder 70 in support means 71 for positioning the holder 70 so that a first side of PCB panel 4 is towards optical scanning unit 66, scanning the first side of PCB panel 4, removing holder 70 together with PCB panel 4 from support means 71 and re-installing it again in support means 71 after having rotated holder 70 over 180° in the horizontal direction. The second side of sheet 4 now faces the optical scanning unit 66, the scanning the second side of PCB panel 4.

While in the preferred embodiment, the drive system is synchronized with the optical system to generate the set of one or more substantially parallel scan lines, in an alternate embodiment, the drive system may operate in an open loop manner during exposure.

FIG. 4 shows an embodiment in which each side of PCB panel 4 is scanned by a single beam, beams 15 and 16 on sides 8 and 9 respectively. In alternate implementations, several beams may be produced for each side by the optical scanning unit of each side of PCB panel 4. For example, a beam splitting device can be placed between laser 31 and optical switch 33 to generate more beams.

While the preferred embodiment shows beams 15 and 16 fixed in direction D, and the carrier moving in direction D, alternatively, the carrier may be fixed in direction D, and the optical beams may be moved over the sheet not only in the scanning direction (that of scan line 19) but also in direction D. That is, the relative motion in direction D may alternatively be provided by moving optical scanning units 17 and 18 instead of carrier 13. According to yet another alternative, both the optical scanning units and the carrier are moved in respect to each other to produce the relative motion. According to yet another alternative embodiment, the panel moves from bottom to top relative to the optical scanning units, while the scan line direction of the laser beams is horizontal, using the gravitational force to some advantage for the transverse direction relative movement, and enabling a smaller footprint for the machine at the cost of extra height. Alternatively, the sheet to be exposed may be placed horizontally. While some of the advantages gained by having the sheet held vertically may be lost, aspects of the invention certainly are not meant to be limited to the sheet being vertical during exposure.

A light-sensitive layer herein includes and is not limited to a layer sensitive to thermal (e.g., infra-red or IR) radiation, visible light, and ultra-violet (UV) radiation. In the case of a thermally-sensitive layer, the layer may be exposed for later processing, and all or part of the layer may be selectively removed or selectively set by exposure during exposing. All or part of the layer may alternatively be selectively removed by the exposing itself. In the case of a visible or UV light-sensitive layer, the layer may be exposed to UV or visible light for later processing. The layer may also be a two-sided charged photoconductor exposed to light for later imaging with a toner. The invention, however, is not limited to any particular type of sensitive layer, or even to the sheet being exposed having a sensitive layer. For example, the invention may also be applied to input scanning a two-sided original, or to directly printing on both sides of a sheet. Also, while the word sheet is commonly understood to mean an object with substantially flat surfaces, this invention also is applicable to exposing two surfaces that are not substantially flat. Thus, the word "sheet" is to be understood herein to include such objects with three-dimensional surfaces on each side.

Because the invention may be realized by using many different optical exposing units, including optical scanning units that form beams and optical imaging units, the term optical exposing unit will be understood to include any of these components of optical system 14.

While optical means and light-sensitive layers are referred to with reference to the embodiments shown in the drawings, it needs to be stated again that the invention is not limited to visible light or UV optical systems. In fact the above described optical exposing units may also be replaced by any kind of optical exposing units at any wavelength in the range of low IR to high UV.

Also, in a very particular embodiment of the invention, the exposing apparatus will not be primarily for creating images, but rather one for detecting, reading and/or inspecting images using for example, reflection of light, the exposing creating the necessary illumination. How to modify any of the embodiments described herein so that the beams created by any of the embodiments of the optical system illuminate both sides of the sheet, and how to add means for reading the light output from an area illuminated by the light beam in order to realize an input scanner rather than a scanner for creating images would be clear to one of ordinary skill in the art. In such a case, the one or more light beams produced by the optical system illuminate one or more scan lines on each side of the sheet, and the exposing apparatus further comprises a light sensor for reading the light output from an area illuminated by a light beam. Those practitioners will recognize that the requirements for focussing a light beam for illumination may not be as stringent as for forming an image.

The present invention is in no way limited to the forms of embodiment described by way of example and represented in the enclosed drawings, however, the present method and device for exposing a sheet may be realized according to different variants, without leaving the scope of the invention.

What is claimed is:

1. A direct imaging apparatus for exposing both sides of a light-sensitive sheet with one or more optical beams according to imaging data, the apparatus comprising:

(a) a carrier for fixing the sheet thereto;
(b) an optical system to generating one or more moving light beams onto each side of the sheet, each light beam forming a scan line on a surface of the sheet in a scan line direction relative to the sheet, each light beam modulated by the imaging data;
(c) a drive system to generate relative motion between any point on any scan line on the sheet and the sheet in a transverse direction, the transverse direction substantially transverse to the scan line direction, the drive system configured to enable each light beam to trace on each side a set of one or more substantially parallel scan lines in the scan line direction, each scan line of the set of scan lines mutually separated in the transverse direction, the sets of scan lines covering a desired region on the side of the sheet; and
(d) a mutual-positioning system coupled to the optical system and including one or more optical detection modules to detect at least one of the moving light beams, the mutual positioning system to accurately position the sets of scan lines on one side of the sheet relative to the sets of scan lines on the other side of the sheet during the generation of the scan lines.

2. apparatus according to claim 1, wherein the carrier holds the sheet in an upright position during exposing such that the weight of the sheet helps keep the sheet flat.

3. The apparatus according to claim 1, further comprising a frame, wherein the drive system is mechanically directly coupled to the frame, the carrier is mechanically directly coupled to the drive system, the one or more optical detection modules of the mutual positioning system are mechanically directly coupled to the frame, and the optical system is mechanically directly coupled to the one or more beam detection modules.

4. The apparatus according to claim 1, further comprising:
(e) a controller coupled to the optical system and the drive system, the controller synchronizing the drive system with the optical system such that each light beam traces the set of one or more substantially parallel scan lines.

5. The apparatus according to claim 1, wherein the drive system includes drive to provide relative motion in the transverse direction between the carrier and the optical system.

6. The apparatus according to claim 5, wherein the drive is a linear motor.

7. The apparatus according to claim 5, wherein the drive includes a motor and a spindle and lead screw mechanism.

8. The apparatus according to claim 1, wherein the optical system comprises:
(i) two optical scanning units, one for each side of the sheet, each scanning unit exposing the desired region of its side of the sheet.

9. The apparatus according to claim 8, wherein the exposing by the two optical scanning unit occurs substantially simultaneously.

10. The apparatus according to claim 9, wherein each of the optical scanning units comprises a source of light energy.

11. The apparatus according to claim 9, wherein the optical system further comprises:
(i) a source of light energy, and
(ii) a mechanism to direct light energy from the energy source to both optical scanning units simultaneously.

12. The apparatus according to claim 9, wherein the optical system further comprises:
(i) a source of light energy, and
(ii) an optical switch for selectively switching light energy from the energy source to one or the other of the optical scanning units.

13. The apparatus according to claim 12, wherein the optical switch alternates the output of the energy source to one and then to the other optical scanning unit.

14. The apparatus according to claim 8, wherein the carrier holds the sheet in an upright position during exposing such that the weight of the sheet helps keep the sheet flat.

15. The apparatus according to claim 14, the sheet having an upper and a lower edge, wherein the carrier comprises a clamping device for holding the sheet at its upper edge, the sheet hanging down during exposing.

16. The apparatus according to claim 14, wherein the scan line direction is vertical.

17. The apparatus according to claim 14, wherein the scan line direction is horizontal and the transverse direction is vertical.

18. The apparatus according to claim 8, wherein the optical scanning units are located on opposite sides of the sheet.

19. The apparatus according to claim 8, wherein each optical scanning unit includes:
(i) an optical head for scanning the beams in the scan line direction.

20. The apparatus according to claim 19, wherein the optical head is a rotating polygon.

21. The apparatus according to claim 19, wherein each optical scanning unit further includes:
(ii) a beam steering element for adjusting the position of the beams in the transverse direction.

22. The apparatus according to claim 21, wherein the optical detection modules include:
a first optical detecting module and a second optical detecting module for each optical scanning unit, the first detecting module and second detecting module respectively detecting the start and end of beam of each scan line of the optical scanning unit,
and wherein the mutual positioning system further includes
a control system coupled to the first and second detecting modules and to the beam steering element, the control system controlling each scan line.

23. The apparatus according to claim 21, wherein each optical scanning unit is configured to generate a scan line of up to at least $(1.6 \times 10-7)/1$ m in length, where l is the wavelength of the light energy in meters.

24. The apparatus according to claim 23, wherein each optical scanning unit is configured to generate a scan line of up to at least $(2.1 \times 10-7)/1$ m in length, where l is the wavelength of the light energy in meters.

25. The apparatus according to claim 8, wherein the one or more optical detection modules in the mutual-positioning system are for determining the cross-beam variation of one of the beams from each optical scanning unit, the determining substantially independent of the focus of the beam.

26. The apparatus according to claim 25, wherein each of the one or more detection modules includes:
(i) a first photo-detector cell having a front edge and a back edge transverse to the in-beam direction;
(ii) a second photo-detector cell adjacent to the first cell in the in-beam direction and having a front edge and a back edge transverse to the in-beam direction, the second cell front edge and the first cell back edge adapted to fit together and mutually adjacent to form a first interface between the first cell and the second cell,
(ii) one or more preamplifiers coupled to the photo-detector cells to measure the response to light traversing the cell, the one or more preamplifier outputs processed to generate a detection module output dependent on the cross-scan position,
the two cells positioned such that a moving beam first hits the first cell front surface, then crosses the interface, and then crosses the second cell back surface,
the first and second cell front and back surfaces shaped such that the relative amount of time the beam traverses each of the cells is indicative of the cross-scan position of the beam, whereby the accuracy of the detection module output is substantially independent of the focus of the beam.

27. A direct imaging apparatus for exposing both sides of a light sensitive sheet according to imaging data, the imaging data including a first side's imaging data for exposing a first side of the sheet and a second side's imaging data for exposing he side other than the first, the apparatus comprising:
(a) carrier for fixing the sheet thereto
(b) two optical exposing units, one for exposing each side of the sheet according to that side's imaging data, the side exposed by any optical exposing unit being that optical exposing unit's corresponding side, each optical exposing unit being an optical scanning unit for scanning one or more light beams onto the corresponding side, each light beam forming a scan line in a scan line direction relative to the sheet, the scan lines modulated by the imaging data;
(c) a mutual-positioning system to accurately position the first side's imaging data on the first side relative to the second side's imaging data on the other side of the sheet, the mutual-positioning system including one or more optical detection modules to detect a light beam, the mutual positioning system active during the exposing of the sides by the optical system; and
(d) a drive system to generate relative motion between any point on any scan line on any side of the sheet and the sheet in a transverse direction, the transverse direction substantially transverse to the scan line direction, the drive system configured to enable each the light beams to trace on each side a set of one or more substantially parallel scan lines in the scan line direction, each of the set of scan lines mutually separated in the transverse direction, each of the sets of scan lines covering a desired region on the side of the sheet.

28. The apparatus according to claim 27, wherein the drive system is synchronized with the optical system to enable each light beam to trace the set of one or more substantially parallel scan lines.

29. The apparatus of claim 27, wherein the one or more optical detection modules are fixed in position relative to the sheet during scanning and fixed in the transverse position relative to the transverse position of the beams from each optical scanning unit, at least one of the optical detecting modules detecting a beam from the other optical scanning unit.

30. The apparatus of claim 27, wherein the mutual positioning system includes one optical detection module fixed in position relative to the sheet during scanning and capable to detecting a beam from either optical scanning unit.

31. The apparatus of claim 29, wherein the one or more optical detection modules each comprises an optical detection unit sensitive to the position of any beam in the transverse direction relative to the detection unit position, the sensitivity to the relative position substantially independent of the thickness of the sheet being scanned.

32. The apparatus of claim 29, wherein the mutual positioning system includes a pair of optical detection modules, one for each side and sensitive to the position in the transverse direction of a beam from that side relative to the detection unit position, the sensitivity to the relative position substantially independent of the thickness of the sheet being scanned.

33. The apparatus of claim 31, wherein the one or more optical detection modules each comprises a plurality of photodiodes cooperating to form a differential signal indicative of the position of any beam in the transverse direction relative to the detection unit position.

34. The apparatus of claim 27, wherein each optical scanning unit further includes a beam steering element to control cross beam positioning of the one or more beams, the beam steering elements coupled to said mutual positioning system (d).

35. The apparatus of claim 29, wherein each optical scanning unit further includes a beam steering element to control cross beam positioning of the one or more beams, the beam steering elements coupled to said mutual positioning system (d) and under control of the output of the optical detection modules.

36. The apparatus according to claim 1, wherein the sheet is a PCB panel.

37. The apparatus according to claim 1, wherein the sheet is sensitive to UV light and the light beams are UV light beams.

38. An optical detection module for measuring the cross-scan position of a moving optical beam in a scanning apparatus, the beam moving in an in-beam direction, the detection module comprising:
  (a) a first photo-detector cell having a front edge and a back edge transverse to the in-beam direction;
  (b) a second photo-detector cell adjacent to the first cell in the in-beam direction and having a front edge and a back edge transverse to the in-beam direction, the second cell front edge and the first cell back edge adapted to fit together and mutually adjacent to form a first interface between the first cell and the second cell,
  (c) one or more preamplifiers coupled to the photo-detector cells to measure the response to light traversing the cell, the one or more preamplifier outputs processed to generate a detection module output dependent on the cross-scan position,
the two cells positioned such that the moving beam first hits the first cell front surface, then crosses the interface, and then crosses the second cell back surface,
the first and second cell front and back surfaces shaped such that the relative amount of time the beam traverses each of the cells is indicative of the cross-scan position of the beam, whereby the accuracy of the detection module output is substantially independent of the focus of the beam.

39. The detection module of claim 38, wherein the photo-detector cells are photodiode cells.

40. The detection module of claim 38, wherein one edge of each cell is straight and perpendicular to the beam direction.

41. The detection module of claim 38, wherein the one or more preamplifiers include a differential integrator.

42. The detection module of claim 40, wherein the straight edges are the front edge of the first cell and the back edge of the second cell, the module further comprising:
  (c) a third cell having a front and a back edge, both edges being straight and perpendicular to the in-beam direction, the third cell placed adjacent to the first and second cell combination, one of the third cell edges against one of the straight edges of the first and second cell combination and forming a second interface between the third cell and the first and second cell combination,
  (d) a differential amplifier coupled to the third cell and the cell of the first and second cell combination adjacent to the third cell, the differential amplifier detecting when the beam crosses the second interface,
whereby the detection of when the beam crosses the second interface is substantially independent of the focus of the beam.

43. The detection module of claim 40, wherein the straight edges are the edges of the first interface, the detection module further comprising:
  (c) a differential amplifier coupled to the first cell and the second cell, the differential amplifier detecting when the beam crosses the first interface,
whereby the detection of when the beam crosses the first interface is substantially independent of the focus of the beam.

44. The detection module of claim 40, wherein each shape of the shaped edges includes an approximately straight line region that provides for an approximately linear response of the detection module output to cross-scan position.

45. The detection module of claim 40, wherein each shape of the shaped edges includes a first cross-beam region and a second cross-beam region such that the detection module output has a different sensitivity to cross-scan position at each of the regions.

46. The detection module of claim 45, wherein the first region and the second region have a distinct boundary.

47. The detection module of claim 45, wherein the first region and the second merge such that there is no distinct boundary therebetween.

48. An apparatus for exposing both sides of a light sensitive sheet according to imaging data, the apparatus comprising:
  an optical system for scanning the sensitive sheet by one or more beams, the optical system including two optical scanning units, each for scanning one side of the sheet by one or more light beams modulated according the imaging data; and
  a mutual positioning system including at least one optical detecting module for detecting the cross-beam position of at least one beam and a control system coupled to the at least one detection module and to the optical system, the control system controlling the cross beam position of the beams to position the beams on one side relative to the beams on the other side during scanning.

49. The apparatus according to claim 48, wherein the two optical scanning units are configures co scan both sides of the sheet simultaneously.

50. The apparatus according to claim 49, wherein the two scanning units are disposed opposite to each other, the apparatus further comprising
  one source for producing a light beam
  a mechanism for alternately feeding said source from to one and then the other optical scanning unit.

51. The apparatus according to claim 48, wherein the two scanning units are disposed opposite to each other, and wherein at least one of said at least one detection module modules can co-operate with a beam produced by the optical scanning unit on the opposite side, the cooperation providing for a mutual adjustment of the beam position on one side of the sheet relative to the beam positions on the other side of the sheet.

52. The apparatus according to claim 1, wherein the sheet is sensitive to IR light and the light beams are IR light beams.

53. The apparatus according to claim 48, further comprising:
  a carrier for fixing the sheet thereto in a vertical position by its upper edge, such that the sheet can hang down freely during exposure.

* * * * *